(12) United States Patent
Sirringhaus et al.

(10) Patent No.: US 7,176,040 B2
(45) Date of Patent: *Feb. 13, 2007

(54) INKJET-FABRICATED INTEGRATED CIRCUITS

(75) Inventors: Henning Sirringhaus, Cambridge (GB); Richard Henry Friend, Cambridge (GB); Takeo Kawase, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 10/175,954

(22) Filed: Jun. 21, 2002

(65) Prior Publication Data

US 2003/0059987 A1    Mar. 27, 2003

Related U.S. Application Data

(63) Continuation-in-part of application No. PCT/GB00/04938, filed on Dec. 21, 2000.

(30) Foreign Application Priority Data

Dec. 21, 1999   (GB)   ................................. 9930217.6
Apr. 20, 2000   (GB)   ................................. 0009913.5

(51) Int. Cl.
      *H01L 21/00*   (2006.01)
(52) U.S. Cl. ............................. 438/6; 438/21; 438/149
(58) Field of Classification Search .................. 438/99, 438/141, 149, 637, 733, 758, 21, 6, 128, 438/618; 257/40, 213, 288, 368
See application file for complete search history.

(56) References Cited

U.S. PATENT DOCUMENTS

| | | | | |
|---|---|---|---|---|
| 5,946,551 A | * | 8/1999 | Dimitrakopoulos et al. | .. 438/99 |
| 5,970,318 A | * | 10/1999 | Choi et al. | ..................... 438/99 |
| 5,981,970 A | * | 11/1999 | Dimitrakopoulos et al. | .. 257/40 |
| 5,989,945 A | * | 11/1999 | Yudasaka et al. | ........... 438/149 |
| 6,037,190 A | * | 3/2000 | Chao et al. | ..................... 438/35 |
| 6,080,606 A | * | 6/2000 | Gleskova et al. | ............ 438/151 |
| 6,087,196 A | * | 7/2000 | Sturm et al. | ................... 438/29 |
| 6,102,528 A | * | 8/2000 | Burke et al. | ................... 347/59 |
| 6,147,870 A | * | 11/2000 | Pommer | ...................... 361/746 |
| 6,150,668 A | * | 11/2000 | Bao et al. | ....................... 257/40 |
| 6,274,508 B1 | * | 8/2001 | Jacobsen et al. | ............. 438/758 |
| 6,284,558 B1 | * | 9/2001 | Sakamoto | ..................... 438/30 |
| 6,284,562 B1 | * | 9/2001 | Batlogg et al. | ............... 438/99 |
| 6,506,438 B2 | * | 1/2003 | Duthaler et al. | .............. 427/58 |
| 6,603,139 B1 | * | 8/2003 | Tessler et al. | ................ 257/40 |

(Continued)

FOREIGN PATENT DOCUMENTS

EP    0 930 641 A2    7/1999

(Continued)

OTHER PUBLICATIONS

International Search Report.

(Continued)

*Primary Examiner*—Brook Kebede
*Assistant Examiner*—Khiem Nguyen
(74) *Attorney, Agent, or Firm*—Sughrue Mion, PLLC

(57) ABSTRACT

A method for forming an integrated circuit including at least two interconnected electronic switching devices, the method comprising forming at least part of the electronic switching devices by ink-jet printing.

26 Claims, 24 Drawing Sheets

U.S. PATENT DOCUMENTS

| | | | |
|---|---|---|---|
| 6,784,037 B2* | 8/2004 | Yamazaki et al. | 438/199 |
| 6,798,030 B1* | 9/2004 | Izumi et al. | 257/428 |
| 2002/0041149 A1* | 4/2002 | Shimoda et al. | 315/504 |
| 2003/0134469 A1* | 7/2003 | Horzel et al. | 438/249 |
| 2005/0026317 A1* | 2/2005 | Sirringhaus et al. | 438/21 |
| 2005/0067618 A1* | 3/2005 | Nakajima et al. | 257/59 |
| 2005/0074928 A1* | 4/2005 | Inoue | 438/149 |
| 2005/0196524 A1* | 9/2005 | Jacobsen et al. | 427/58 |

FOREIGN PATENT DOCUMENTS

| | | |
|---|---|---|
| GB | 2 330 451 | 4/1999 |
| WO | WO 98/37133 A1 | 8/1998 |
| WO | WO 99/21233 A1 | 4/1999 |

OTHER PUBLICATIONS

Redecker M., et al. "Nondispersive hole transport in an electroluminescent polyfluorene" Applied Physics Letter, vol. 73, No. 11, Sep. 14, 1998, pp. 1565-1567.

Redecker M., et al. "Mobility enhancement through homogeneous nematic alignment of a liquid-crystalline polyfluorene" Applied Physics Letter, vol. 74, No. 10, Mar. 8, 1999, pp. 1400-1402.

Sirringhaus, H.et al., "High-Mobility Conjugated Polymer Field-Effect Transistors", Cavendish Laboratory, University of Cambridge, Madingley Road, Cambindge CB3 OHE, UK, pp. 101-110.

Katz, H.E., "Organic molecular solids as thin film transistor semiconductors", J. Mater. Chem., 1997, 7(3), pp. 369-376.

Setayesh, S., et al., "Bridging the Gap between Polyfluorene and Ladder-Poly-p-phenylene: Synthesis and Characterization of Poly-2, 8-indenofluorene", American Chemical Society, Macromolecules 2003, 33, pp. 2016-2020.

Grimme, Julian, et al. "On the Conjugation Length in Poly (paraphenylene)-Type Polymers", Adv. Mater. 1995, 7, No. 3, pp. 292-295.

McCullough, R., "The Chemistry of Conducting Polythiophenes", Adv. Mater. 1998, 10, No. 2, pp. 93-116.

Katz, H.E., et al., "A soluble and air-stable organic semiconductor with high electron mobility", Nature, vol. 404, Mar. 30, 2000, pp. 478-481.

Sugimura, Hiroyuki, et al., "Micropatterning of Alkyl- and Fluoroalkylsilane Self-Assembled Monolayers Using Vacuum Ultraviolet Light", 2000 American Chemical Society, Langmuir 2000, 16, pp. 885-888.

Brittain, Scott, et al., "Soft lithography and microfabrication" Physics World, May 1998, pp. 31-36.

Laquindanum, Joyce G. et al., "Synthesis, Morphology, and Field-Effect Mobility of Anthradithiophenes", J. Am. Chem. Soc. 1998, 120, pp. 664-672.

Rogers, John A., et al, "Low-voltage 0.1 μm organic transistors and complementary inverter circuits fabricated with a low-cost form of near-field photolithography", Applied Physics Letters, vol. 75, No. 7, Aug. 16, 1999, pp. 1010-1012.

Bao, Zhenan, et al., "High-Performance Plastic Transistors Fabricated by Printing Techniques", Chem. Mater., 1997, pp. 1299-1301.

Comiskey, Barrett, et al., "An electrophoretic ink for all-printed reflective electronic displays", Nature, vol. 394, Jul. 16, 1998, pp. 253-255.

Bao, Zhenan, "Materials and Fabrication Needs for Low-Cost Organic Transistor Circuits", Adv. Mater. 2000, 12, No. 3, pp. 227-230.

Kagan, C.R., et al., "Organic-Inorganic Hybrid Materials as Semiconducting Channels in Thin-Film Field-Effect Transistors", SCIENCE, vol. 286, Oct. 29, 1999, pp. 945-947.

Ridley, Brent A., et al, "All-Inorganic Field Effect Transistors Fabricated by Printing", Science, vol. 286, Oct. 22, 1999, pp. 746-748.

Leeuw, Dago de, "Plastic electronics", Physics World, Mar. 1999, pp. 31-34.

Deegan, Robert D., "Capillary flow as the cause of ring stains from dried liquid drops", Nature, vol. 389, Oct. 23, 1997, pp. 827-829.

\* cited by examiner (a)

TFB (b)

POLYSTLRENE (a)

(b)

(a)

(b)

(a)

(c)

(a)

(b)

(a)

(b)

(c)

INKJET-FABRICATED INTEGRATED CIRCUITS

This is a Continuation-In-Part of Application No. PCT/GB00/04938 filed Dec. 21, 2000; the disclosure of which is incorporated herein by reference.

This invention relates to integrated circuits fabricated by ink-jet techniques.

Semiconducting conjugated polymer thin-film transistors (TFTs) have recently become of interest for applications in cheap, logic circuits integrated on plastic substrates (C. Drury, et al., APL 73, 108 (1998)) and optoelectronic integrated devices and pixel transistor switches in high-resolution active-matrix displays (H. Sirringhaus, et al., Science 280, 1741 (1998), A. Dodabalapur, et al. Appl. Phys. Lett. 73, 142 (1998)). In test device configurations with a polymer semiconductor and inorganic metal electrodes and gate dielectric layers high-performance TFTs have been demonstrated. Charge carrier mobilities up to 0.1 $cm^2/Vs$ and ON-OFF current ratios of $10^6$–$10^8$ have been reached, which is comparable to the performance of amorphous silicon TFTs (H. Sirringhaus, et al., Advances in Solid State Physics 39, 101 (1999)).

Thin, device-quality films of conjugated polymer semiconductors can be formed by coating a solution of the polymer in an organic solvent onto the substrate. The technology is therefore ideally suited for cheap, large-area solution processing compatible with flexible, plastic substrates. To make full use of the potential cost and ease of processing advantages it is desirable that all components of the devices including the semiconducting layers, the dielectric layers as well as the conducting electrodes and interconnects are deposited from solution.

To fabricate all-polymer TFT devices and circuits the following main problems have to be overcome:

Integrity of multilayer structure: During solution deposition of subsequent semiconducting, insulating and/or conducting layers the underlying layers should not be dissolved, or swelled by the solvent used for the deposition of the subsequent layers. Swelling occurs if solvent is incorporated into the underlying layer which usually results in a degradation of the properties of the layer.

High-resolution patterning of electrodes: The conducting layers need to be patterned to form well-defined interconnects and TFT channels with channel lengths $L \leq 10$ μm.

To fabricate TFT circuits vertical interconnect areas (via holes) need to be formed to electrically connect electrodes in different layers of the device.

In WO 99/10939 A2 a method to fabricate an all-polymer TFT is demonstrated that relies on the conversion of the solution-processed layers of the device into an insoluble form prior to the deposition of subsequent layers of the device. This overcomes the problems of dissolution and swelling of underlying layers. However, it severely limits the choice of semiconducting materials, that can be used, to the small and in several respects undesirable class of precursor polymers. Furthermore, cross-linking of the dielectric gate insulating layer makes the fabrication of via-holes through the dielectric layers difficult, such that techniques such as mechanical punching are used (WO 99/10939 A1).

According to aspects of the present invention there is provided device(s) and method(s) as set out in the accompanying independent claims. Preferred features are set out in the dependant claims.

According to a first aspect of the present invention there is provided a method for forming an integrated circuit including at least two interconnected electronic switching devices, the method comprising forming at least part of the electronic switching devices by ink-jet printing.

According to a second aspect of the present invention there is provided a method for forming an integrated circuit comprising electronic switching devices and one or more of the following elements: interconnects, via-hole interconnections, resistors, capacitors, diodes, display elements, the method comprising forming at least part of the switching elements and at least one of the other elements by ink-jet printing.

According to a third aspect of the present invention there is provided a method for forming an integrated circuit comprising electronic switching devices interconnected by via-hole interconnections; the method comprising forming the via-hole connections by ink-jet printing.

The step of ink-jet printing may comprise ink-jet printing electrically conductive material. Such conductive material preferably forms electrodes of the devices.

The step of inkjet printing may comprise ink-jet printing semiconductive material. Such semiconductive material may form active layers of the switching devices.

The semiconductive material is a conjugated polymer, preferably a conjugated block copolymer. The semiconductive material may comprise a block copolymer comprising a first block of conjugated monomer units each linked by at least two covalent bonds, and a second block of monomer units, the block copolymer having an electron affinity greater than 3.0 eV or 3.5 eV. The semiconductor material may comprise a block copolymer comprising a first block of conjugated monomer units each linked by at least two covalent bonds, and a second block of monomer units, the block copolymer having an ionisation potential in the range from 5.5 eV to 4.9 eV. The first block of monomer units may comprise one or more of the group comprising a fluorene derivative, a phenylene derivative and an indenofluorene derivative and the second block of monomer units comprises one or more of the group comprising a thiophene derivative, a triarylamine derivative and a benzothiadiazole derivative. The semiconductive material may be F8T2 or TFB.

The semiconductive material may comprise a liquid-crystalline conjugated polymer. The step of ink-jet printing may comprise ink-jet printing a solvent on to localised regions of insulating layers of the devices so as to dissolve the insulating layers in the regions to leave voids extending through the layers. The method may then further comprise the step of depositing electrically conductive material in the voids.

The step of ink-jet printing suitably comprises ink-jet printing a diffusive dopant on to localised regions of insulating layers of the devices so as to modify the insulating layers in the regions and thereby form a channel of electrically conductive material extending through the layers.

The method may comprise the step of depositing electrically conductive material by ink-jet printing between the devices so as to electrically interconnect the devices.

The method may comprise the step of depositing electrically insulating material by ink-jet printing between the devices so as to electrically isolate the devices.

The devices may preferably be transistors.

The step of ink-jet printing is suitably performed by means of an ink-jet printer having at least one printing head operable under computer control to deposit material in a selected location on the substrate.

The step of ink-jet printing suitably includes the steps of detecting optical contrast one the substrate, and performing processing on the basis of the contrast in order to direct the printing head under computer control.

The method may comprise the step of forming a display element over at least one of the transistors with an electrode of the display element in electrical connection with an electrode of one of the transistors.

According to a further aspect of the present invention there is provided a method for defining an electronic circuit from an electronic device array comprising a substrate and a plurality of transistors located on the substrate, each transistor having at least one interconnection electrode for allowing interconnection of the transistors; the method comprising defining a pattern of interconnection between at least two of the transistors by ink-jet printing conductive material on the substrate so as to provide a conductive path between two of the interconnection electrodes.

One of the said two transistors may be part of a pre-connected functional block of transistors on the substrate. Preferably each of the transistors is formed from polymer material Suitably the polymer material comprises a conductive or semiconductive polymer.

The substrate suitably includes one or more passive circuit elements. Then the method preferably includes the step of ink-jet printing conductive material on the substrate so as to provide a conductive path between an interconnection electrode of one of the transistors and one of the passive circuit elements.

The substrate preferably includes one or more further active circuit elements.

The method suitably comprises the step of forming a display element over at least one of the transistors with an electrode of the display element in electrical connection with an electrode of one of the transistors.

The step of ink-jet printing may be performed by means of an ink-jet printer having at least one printing head operable under computer control to deposit material in a selected location on the substrate.

The step of ink-jet printing suitably includes the steps of detecting optical contrast one the substrate, and performing processing on the basis of the contrast in order to direct the printing head under computer control to achieve good registration accuracy with respect to a previously deposited pattern.

The ink-jet printer may be operable for depositing conductive and/or insulating material in order to define a user-selected circuit on the substrate by means of ink-jet printing.

The method may comprise ink-jet printing a solvent on to localised regions of insulating layers of the devices so as to dissolve the insulating layers in the regions to leave voids extending through the layers, and depositing electrically conductive material in the voids.

The substrate suitably includes a structure between electrodes of the transistors for confining liquid deposited on the substrate in a pre-defined path between the electrodes by means of relative attraction and/or repellence for the liquid.

According to a further aspect of the present invention there is provided an electronic device formed by a method as set out above.

According to a further aspect of the present invention there is provided a method for defining an electronic device from a substrate comprising an array of first surface zones separated from each other by second surface zones, the method including the step of defining electrodes of a plurality of transistors on the substrate by depositing an electrically conductive polymer material from solution in a solvent that is relatively attracted by the first surface zones and relatively repelled by the second surface zones so as to cause the material to be segregated into regions corresponding to the first zones, and forming subsequent functional regions of the transistors so as to interconnect material in regions corresponding to adjacent first zones as electrodes of a single transistor.

Suitably, in order to define a plurality of transistors on the substrate, the second surface zones have a greater repellence for a selected solvent than the first surface zones.

The method suitably comprises deposition of polymer transistors with channel lengths defined by the repelling surface regions, but with user-defined locations and with user-defined channel widths; the method further comprising ink-jet printing of conductive material so as to provide interconnections between the transistors and/or opening of via-holes through insulating layers by local deposition of solvents and/or ink-jet printing of insulating layers in the overlap region of two interconnects According to a further aspect of the present invention there is provided a method for defining an electronic device from an electronic device array comprising a substrate and a plurality of transistors or functional blocks of transistors located on the substrate, each transistor or functional block having at least one interconnection electrode for allowing interconnection of the transistors; the method comprising defining a pattern of interconnection between at least two of the transistors by any one or more of the following steps: ink-jet printing conductive material so as to provide a conductive path between two of interconnection electrodes; opening a via-hole through an insulating layer of a transistor by local deposition of solvents on to an insulating layer of the transistor; and ink-jet printing an insulative material in the region between two transistors or functional blocks.

The present invention will now be described by way of example, with reference to the accompanying drawings, in which.

Preferred fabrication methods described herein permit the fabrication of an all-organic, solution-processed thin-film transistor, in which none of the layers is converted or cross-linked into an insoluble form. Each layer of such a device may remain in a form that is soluble in the solvent from which it was deposited. As will be described in more detail below, this enables a simple way of fabricating via-holes through dielectric insulating layers based on local deposition of solvents.

Such a device may, for example, comprise one or more of the following components:

- patterned conducting source-drain and gate electrodes and interconnects.
- a semiconducting layer with a charge carrier mobility exceeding 0.01 cm$^2$/Vs and a high ON-OFF current switching ratio exceeding 10$^4$.
- a thin gate insulating layer.
- a diffusion barrier layer that protects the semiconducting layer and the insulating layer against unintentional doping by impurities and ionic diffusion.
- a surface modification layer that enables high-resolution patterning of the gate electrode by printing techniques.
- via-holes for interconnects through dielectric layers.

However, it will be appreciated that the methods described herein are not limited to the fabrication of devices having all the features set out above.

Figure 1:
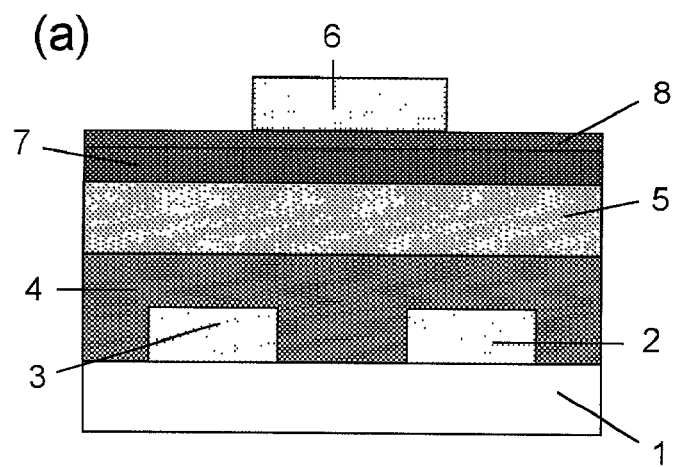
FIG. 1 shows different device configurations of solution processed, all-polymer TFTs.
Figure 1:
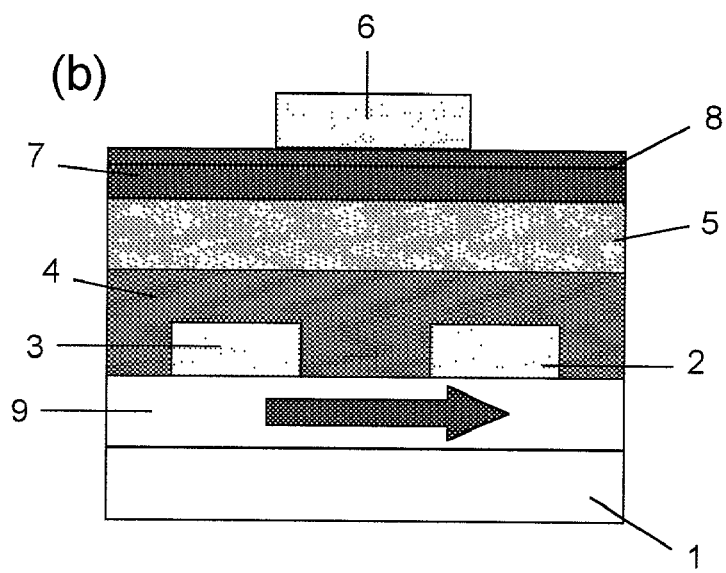
Figure 1:
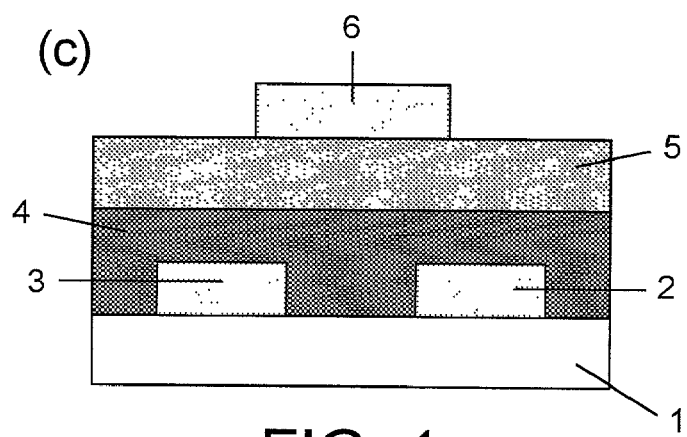

The fabrication of a first illustrative device will now be described with reference to FIG. 1. The device of FIG. 1 is a thin-film field effect transistor (TFT) configured to have a top-gate structure.

On top of a cleaned 7059 glass substrate 1 source-drain electrodes 2, 3 and interconnect lines between the electrodes and the contact pads (not shown) are deposited by ink-jet printing a solution of the conducting polymer polyethylene-dioxythiophene/polystyrolsulfonate (PEDOT (0.5 weight %)/PSS (0.8 weight %)) in water. Other solvents such as methanol, ethanol, isopropanol or acetone may be added to affect surface tension, viscosity and wetting properties of the ink. PEDOT/PSS is obtained commercially from Bayer (available as "Baytron P"). The IJP printer is of the piezoelectric type. It is equipped with a precision two-dimensional translation stage and a microscope stage enabling the alignment of subsequently printed patterns with respect to each other. The IJP head is driven with a voltage pulse. Suitable drive conditions to eject droplets of a typical solid content of 0.4 ng per droplet are achieved with a pulse height of 20V, rise time of 10 μs, and a fall time of 10 μs. After drying on the glass substrate they produce a PEDOT dot with a typical diameter of 50 μm, and typical thickness of 500 Å.

The IJP of the source-drain electrodes is performed in air. Afterwards the samples are transferred to an inert atmosphere glove box system. The substrates are then spun-dried in the organic solvent that will later be used for the deposition of the active semiconducting layer, such as mixed xylenes in the case of polyfluorene polymers. They are then annealed for 20 minutes at 200° C. in inert nitrogen atmosphere to remove residual solvent and other volatile species in the PEDOT/PSS electrodes. Then a 200–1000 Å thick film of the active semiconducting polymer 4 is deposited by spin-coating. Various semiconducting polymers have been used such as regioregular poly-3-hexylthiophene (P3HT), and polyfluorene co-polymers such as poly-9,9'-dioctylfluo-rene-co-dithiophene (F8T2). F8T2 is a preferred choice as it exhibits good stability in air during the deposition of the gate electrode in air. A 5–10 mg/ml solution of F8T2 in anhydrous, mixed xylenes (purchased from Romil) is spin-coated at 1500–2000 rpm. In the case of P3HT a 1 weight % solution in mixed xylene was used. The underlying PEDOT electrodes are insoluble in a non-polar organic solvent such as xylene. The films are then spun-dried in the solvent that will later be used for the deposition of the gate insulator layer 5, such as isopropanol or methanol.

A subsequent annealing step can then be performed to enhance the charge transport properties of the semiconducting polymer. For polymers that exhibit a liquid crystalline phase at elevated temperatures annealing at a temperature above the liquid-crystalline transition results in orientation of the polymer chains parallel to each other. In the case of F8T2, annealing is performed at 275–285° C. for 5–20 min under inert N$_2$ atmosphere. The samples are then rapidly quenched to room temperature to freeze in the orientation of the chains and produce an amorphous glass. If samples are prepared on plain glass substrates without an alignment layer the polymer adopts a multidomain configuration in which several liquid-crystalline domains with random orientation are located within the TFT channel. Transistor devices in which the F8T2 is prepared in a glassy state by quenching from a liquid-crystalline phase exhibit mobilities on the order of 5·10$^{-3}$ cm$^2$/Vs, that are by more than an order of magnitude higher than mobilities measured on devices with as-spun F8T2 films. As-deposited devices also exhibit higher turn-on voltages V$_0$. This is attributed to a lower density of localized electronic trap states in the glassy phase compared to the as-deposited phase, that is partially crystalline.

Further improvements of the mobility by typically a factor of 3–5 can be obtained if the polymer is prepared in a monodomain state with uniaxial alignment of the polymer chains parallel to the transistor channel. This can be achieved by coating the glass substrate with a suitable alignment layer such as a mechanically rubbed polyimide layer (9 in FIG. 1(b)). In the monodomain state the polymer chains are aligned uniaxially parallel to the rubbing direction of the underlying polyimide layer. This results in a further enhancement of charge carrier mobility in devices in which the TFT channel is parallel to the alignment direction of the chains. Such a process is described in more detail in our co-pending UK patent application number 9914489.1.

After deposition of the semiconductor layer, the gate insulating layer 5 is deposited by spin-coating a solution of polyhydroxystyreqne (also-called polyvinylphenol (PVP)) from a polar solvent in which the underlying semiconducting polymer is not soluble. A preferred choice of solvents are alcohols such as methanol, 2-propanol or butanol, in which non-polar polymers such as F8T2 have exceptionally low solubility and do not swell. The thickness of the gate insulating layer is between 300 nm (solution concentration 30 mg/ml) and 1.3 µm (solution concentration 100 mg/ml). Other insulating polymers and solvents that satisfy the solubility requirements such as poly-vinylalcohol (PVA) in water or poly-methyl-methacrylate (PMMA) in butyl acetate or propylene glycol methyl ether acetate may also be used.

The gate electrode 6 is then deposited over the gate insulating layer. The gate electrode layer may be deposited directly over the gate insulating layer (see FIG. 1(c)) or there may be one or more intermediate layers (see FIG. 1(a) and (b)), for example for surface modification, diffusion barrier or process reasons such as solvent compatibility.

Figure 2:
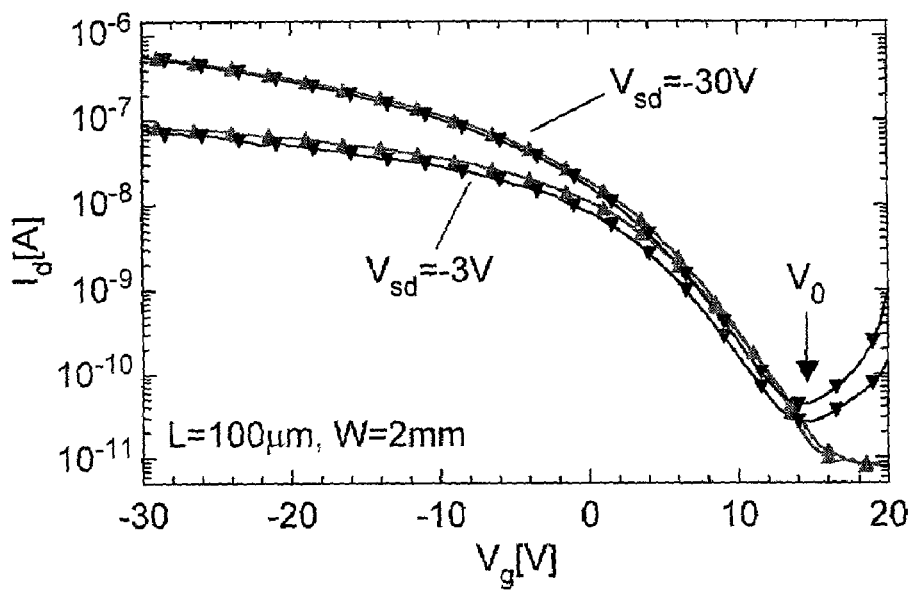
FIG. 2 shows transfer characteristics of polymer TFTs according to FIG. 1c with a F8T2 active layer, a PVP gate insulating layer, and a PEDOT/PSS gate electrode.
Figure 2:
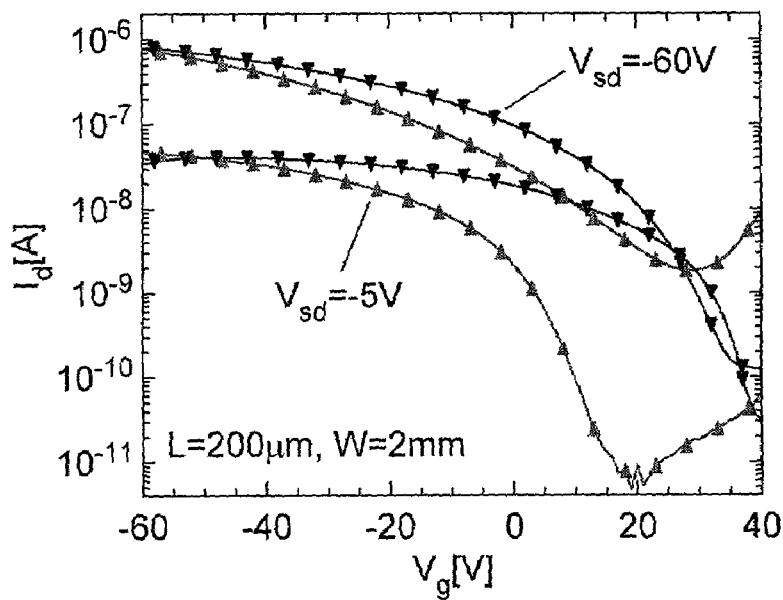

To form the simpler device of FIG. 1(c) a PEDOT/PSS gate 6 may be printed directly on top of the PVP insulating layer 5. The substrate is transferred to the IJP station in air again where a PEDOT/PSS gate electrode pattern is printed from a water solution. The underlying PVP gate insulating layer has a low solubility in water such that the integrity of the gate dielectric is preserved during the printing of the PEDOT/PSS gate electrode. Although PVP contains a large density of polar hydroxyl groups, its solubility in water is low because of the very non-polar polystyrene-like backbone. Similarly PMMA is insoluble in water. FIG. 2 shows the transfer characteristics of an IJP TFT with a F8T2 semiconducting layer, a PVP gate insulating layer, and IJP PEDOT/PSS source-drain and gate electrodes. The device characteristics are measured under nitrogen atmosphere. Consecutive measurements are shown with increasing (upward triangles) and decreasing (downward triangles) gate voltage, respectively. The characteristics belong to devices made from a freshly prepared batch (a) and a one-year old batch (b) of PEDOT/PSS (Baytron P). Transistor action can clearly be seen, however, the devices exhibit an unusual normally-on behaviour with positive threshold voltages $V_0 > 10V$, whereas reference devices fabricated with evaporated gold source-drain and gate electrodes were found to exhibit normally off behaviour ($V_0 < 0$). In devices formed from the "old" batch of PEDOT (FIG. 2(b)) large hysteresis effects were observed which are attributed to high concentration of mobile ionic impurities (see below). If the sweep is started in deep depletion ($V_g = +40V$), the transistor turns on at $V^f_0 \approx +20V$ (upward triangles). However, on the reverse scan (downward triangles) the transistor only turns off at $V^r_0 > +35V$.

The normally-on behaviour and the hysteresis effects are likely to be caused by the diffusion of ionic species in one of the layers of the device. The unusually large positive values of $V_0$ suggest that the ion is negative. A positive species would be expected to compensate some of the mobile charge in the accumulation layer and lead to a shift of $V_0$ to more negative values. To identify the origin of this ionic species devices were fabricated in which the top-gate IJP PEDOT electrode was replaced by an evaporated gold electrode while the other layers and the PEDOT source/drain electrodes were fabricated as described above. It was found that in this configuration the devices are normally-off and exhibit stable threshold voltages. This implies that the doping and hysteresis effects in the all-polymer device are related to the solution deposition of the conducting polymer top gate electrode, and the possible diffusion of mobile, ionic impurities from the PEDOT solution/film into the underlying layers of the device.

Figure 3:
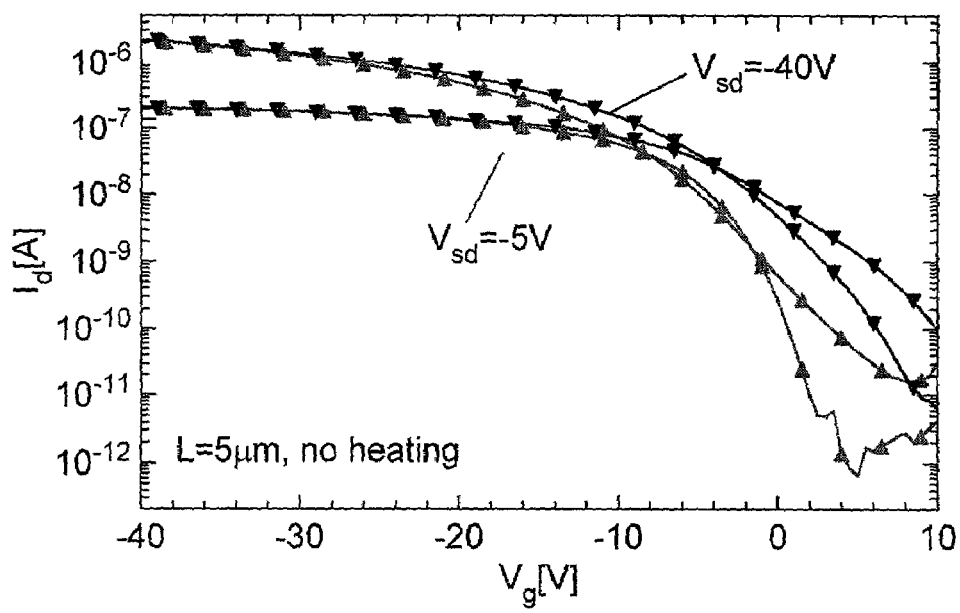
FIG. 3 shows transfer characteristics of polymer TFTs according to FIG. 1c with a F8T2 active layer, a PVP gate insulating layer, and a PEDOT/PSS gate electrodes deposited with the sample held at room temperature (a) and approximately 50° C. (b).
Figure 3:
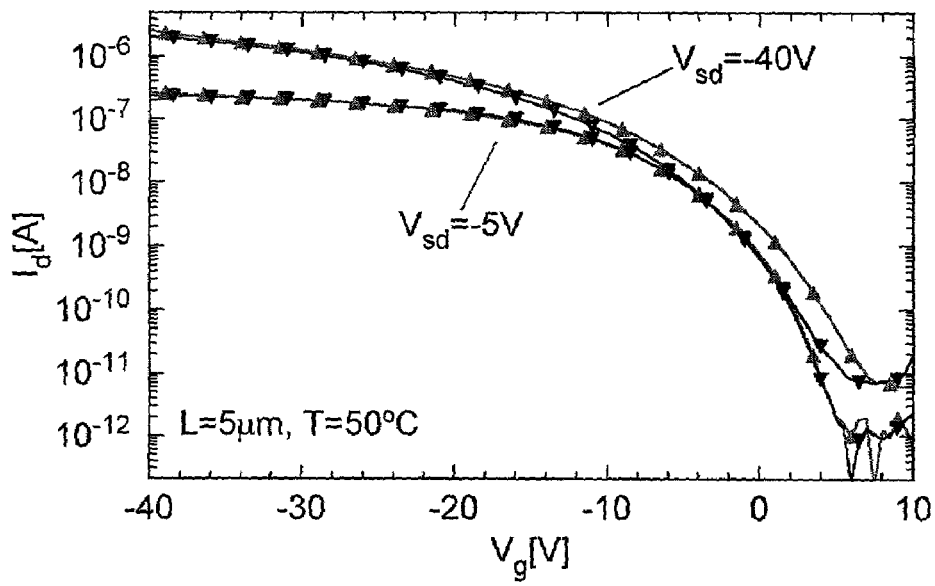

It was found to be possible to control the value of the threshold voltage and to reduce the amount of hysteresis by depositing the gate electrode onto a heated substrate. This reduces the drying time of the droplet on the substrate. FIG. 3(b) shows the transfer characteristics of a TFT device for which the substrate was heated to a temperature of 50° C. during deposition of the gate electrode. It can be seen that the hysteresis effect is much smaller than for gate deposition at room temperature (FIG. 3b), and that $V_0$ has a relatively small positive value of 6V. By controlling the deposition temperature the threshold voltage can be adjusted in a range of $V_0 = 1-20V$.

Figure 14:
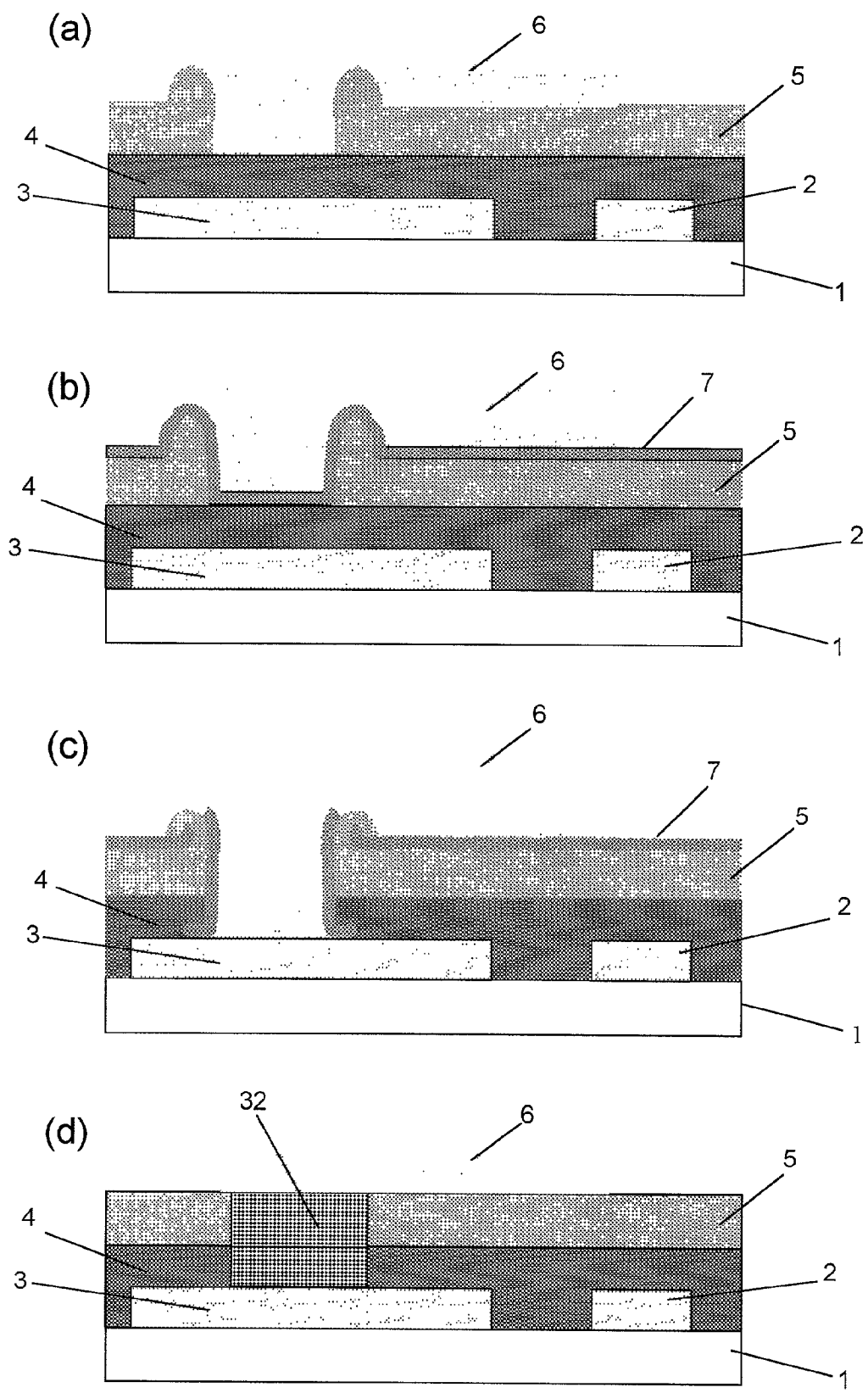
FIG. 14 illustrates different processes to fabricate via-holes.

Devices with gate electrodes deposited directly onto the PVP layer as in FIG. 1(c) are of the depletion-type. This normally-on behaviour is useful for depletion-type logic circuits such as the simple depletion-load logic inverter (FIG. 14(a)).

To fabricate enhancement-type, normally-off TFTs the doping of the semiconductor during the deposition of the gate can be prevented by incorporation of a diffusion barrier layer. In the device of FIG. 1(a) and (b) a thin layer 7 of a non-polar polymer is deposited on top of the PVP gate insulating layer prior to the deposition of the conducting polymer gate electrode. This layer is believed to act as diffusion barrier blocking the diffusion of ionic species through the moderately polar PVP insulator. PVP contains a high density of polar hydroxyl groups which tend to enhance the conductivity and diffusivity of ions through the film. Several non-polar polymers have been used such as poly-9,9'-dioctylfluorene (F8), polystyrene (PS), poly(9,9'-dioctyl-fluorene-co-N-(4-butylphenyl) diphenylamine) (TFB) or F8T2. Thin films of these polymers on the order of 50–100 nm can be deposited on the surface of the PVP gate insulating layer from a solution in a non-polar organic solvent such as xylene, in which PVP is insoluble.

Direct printing of PEDOT/PSS from a polar solution in water on top of the non-polar diffusion barrier layer or on top of a moderately polar polymer such as PMMA has been found to be problematic because of poor wetting and large contact angles. To address this, a surface modification layer 8 is deposited on top of the non-polar polymer. This layer provides a hydrophilic rather than hydrophobic surface on to which the PEDOT/PSS may more readily be formed. This permits enables high-resolution printing of the gate electrode pattern. To form the surface modification layer a thin layer of PVP can be deposited from isopropanol solution, in which the underlying diffusion barrier layer is insoluble. The thickness of the PVP layer is preferably less than 50 nm. High-resolution printing of PEDOT/PSS is possible on the surface of PVP. Alternative surface modification layers may be used. These include thin layers of soap-like surfactants or polymers containing a hydrophilic and a hydrophobic functional group. These molecules would tend to phase-separate with the hydrophobic and hydrophilic groups being attracted towards the interface with the underlying non-polar polymer and the free surface, respectively. Another possibility is the brief exposure of the surface of the non-polar diffusion barrier to a mild $O_2$ plasma rendering the surface hydrophilic. A suitable plasma treatment that does not degrade the TFT device performance is exposure to a 13.5 MHz $O_2$ plasma with a power of 50 W for 12 s.

A surface modification layer on top of the non-polar diffusion barrier may not be required if the gate electrode is printed from a solvent that is less polar than water such as formulation containing alcohols (isopropanol, methanol etc.).

The integrity of the layer sequence relies on the alternating deposition of polymer materials from polar and non-polar solvents. It is desirable that the solubility of a first layer in the solvent used for the deposition of a second layer is less than 0.1% weight per volume, preferably less than 0.01% weight per volume.

The criterion for solvent compatibility may be quantified using the Hildebrand solubility parameters by which the degree of polarity can be quantified (D. W. van Krevelen, Properties of polymers, Elsevier, Amsterdam (1990)). The solubility behaviour of each polymer (solvent) is described by three characteristic parameters $\delta_d$, $\delta_p$, $\delta_h$, characterising the degree of dispersive interactions, polar, and hydrogen bonding interactions between polymer (solvent) molecules in the liquid state. Values for these parameters can be calculated if the molecular structure is known by adding contributions from the different functional groups of the polymer. They are tabulated for most common polymers. Often $\delta_p$ and $\delta_d$ are combined to $\delta_v^2 = \delta_d^2 + \delta_p^2$.

The free energy of mixing is given by $\Delta G_m = \Delta H_m - T \cdot \Delta S_m$, where $\cdot \Delta S_m > 0$ is the entropy of mixing and $\Delta H_m = V \cdot \phi_P \cdot \phi_S \cdot ((\delta_v^P - \delta_v^S)^2 + (\delta_h^P - \delta_h^S)^2)$. (V: volume; $\phi_P$, $\phi_S$: volume fraction of polymer (P)/solvent (S) in the mixture). From this it is expected that a polymer (P) is the more soluble in a solvent (S) the smaller $\Delta H_m$, i.e., the smaller $D = ((\delta_v^P - \delta_v^S)^2 + (\delta_h^P - \delta_h^S)^2)^{1/2}$. As an approximate criterion, if the interaction parameter D is smaller than approximately 5 the polymer is soluble in the solvent. If D is between 5–10, swelling is often observed. If D is larger than 10, the polymer is substantially insoluble in the solvent, and no swelling occurs. In order to obtain sufficiently abrupt interfaces in a solution-processed TFT device it is therefore desirable that the respective D values for each of the polymer layers and the solvent of the next layer should be larger than approximately 10. This is particularly important for the semiconducting polymer layer and the solvent of the gate dielectric. In the case of F8T2 and isopropanol (butyl acetate) we estimate D to be approximately 16 (12).

For some device configurations the entire multilayer structure may be built up by an alternating sequence of polymers that contain mainly polar groups and are soluble in a highly polar solvent such as water, and polymers that contain only a few or do not contain any polar groups and are soluble in a non-polar solvent, such as xylene. In this case the interaction parameter D is large because of the differences of $\delta_p$ for the polymer layer and solvent of the next layer. An example would be a transistor device comprising a highly polar source-drain electrode of PEDOT/PSS, a non-polar semiconducting layer such as F8T2, a highly-polar gate dielectric layer such as a polyvinylalcohol deposited from water solution, a non-polar diffusion barrier layer of TFB that also acts as a buffer layer to allow the deposition of the layer sequence, and a PEDOT/PSS gate electrode.

However, it is often convenient to have a non-polar semiconducting layer and a polar gate electrode layer separated by a single dielectric layer. This layer sequence is also possible by using a moderately polar polymer layer deposited from a moderately polar solvent sandwiched between the highly polar and nonpolar polymer layer. A moderately polar polymer is a polymer that contains both polar and non-polar groups, and is substantially insoluble in a highly polar solvent. Analogously, a moderately polar solvent contains both polar and non-polar groups, but does not substantially dissolve a non-polar polymer. In terms of the solubility parameters a moderately polar solvent may be defined as one where the solubility parameter $\delta_h$ is largely different from that of the underlying polymer. In this case swelling may be avoided (large D) even if the polar solubility parameter $\delta_p$ ($\delta_v$) of the solvent may be similar to that of the underlying polymer layer. The moderately polar polymer may contain a specific functional group such as a hydroxyl group that makes it soluble in a solvent containing a functional group that is attracted to the functional group of the polymer. This attraction may be a hydrogen bonding interaction. This functionality of the polymer may be used to enhance its solubility in a moderately polar solvent and decrease its solubility in a polar solvent. An example of a moderately polar polymer is a PVP gate dielectric layer sandwiched between a non-polar semiconductor layer and a PEDOT/PSS gate electrode layer (FIG. 1c). An example of a moderately polar solvent is an alkylalcohol such as IPA ($\delta_h$=8; F8T2: $\delta_h \approx 0$).

Figure 4:
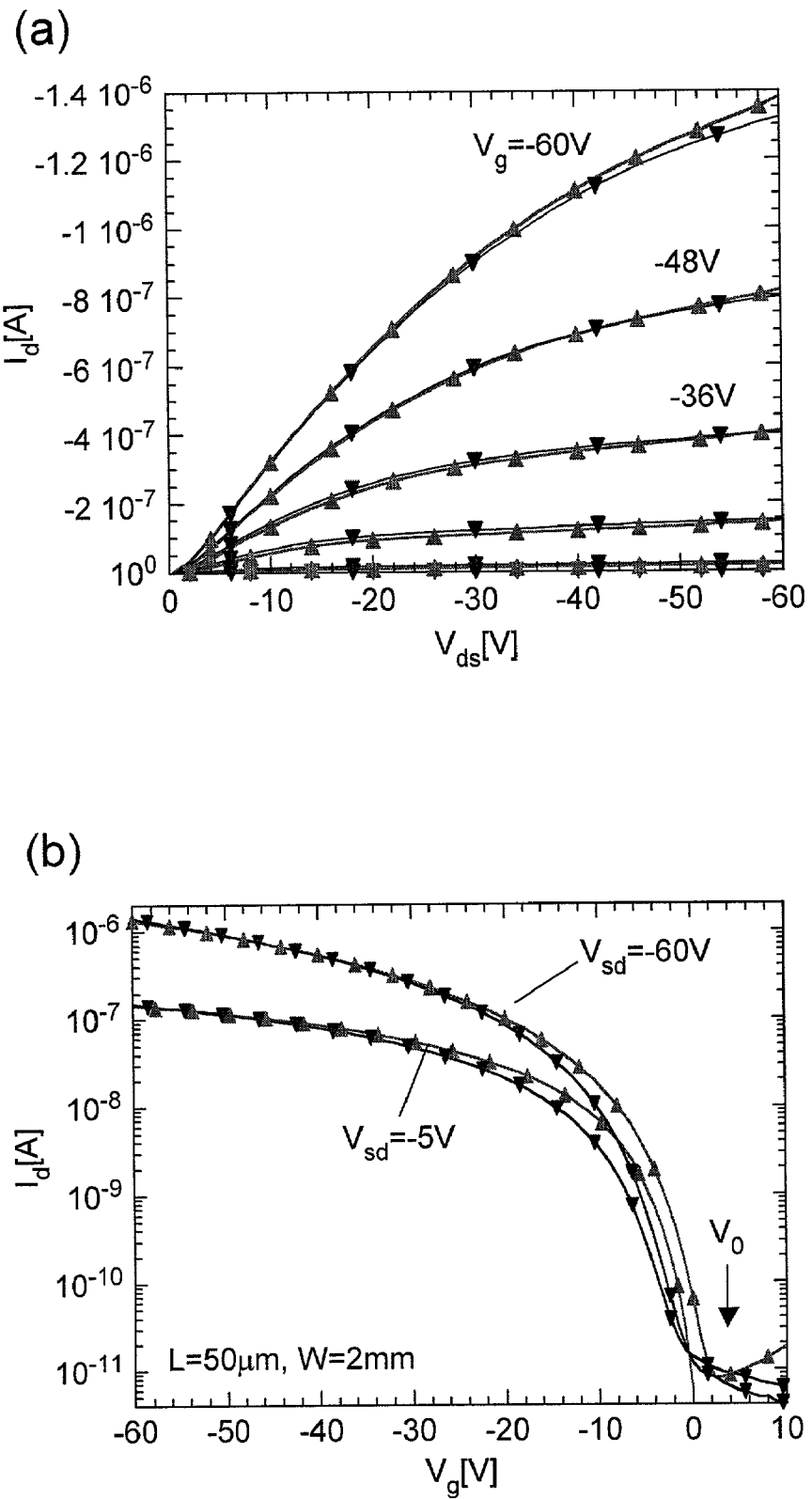
FIG. 4 shows output (a) and transfer characteristics (b) of a F8T2 all-polymer TFT containing a F8 diffusion barrier and a PVP surface modification layer as in FIG. 1(a)

FIG. 4 shows the output (a) and transfer (b) characteristics of an all-polymer F8T2 IJP TFT with a PVP gate insulator layer, a F8 diffusion barrier layer and a PVP surface modification layer, as illustrated in FIG. 1(a) (L=50 μm). The device exhibits clean, near-ideal normally-off transistor action with turn-on at $V_0 \leq 0V$. The threshold voltage shift between upward (upward triangles) and downward (downward triangles) voltage sweeps is $\leq 1V$. The device characteristics are very similar to those of standard devices fabricated under inert atmosphere conditions with Au source-drain and gate electrodes. The field effect-mobility is on the order of 0.005–0.01 $cm^2/Vs$ and the ON-OFF current ratio measured between $V_g$=0 and −60V is on the order of $10^4$–$10^5$.

Figure 5:
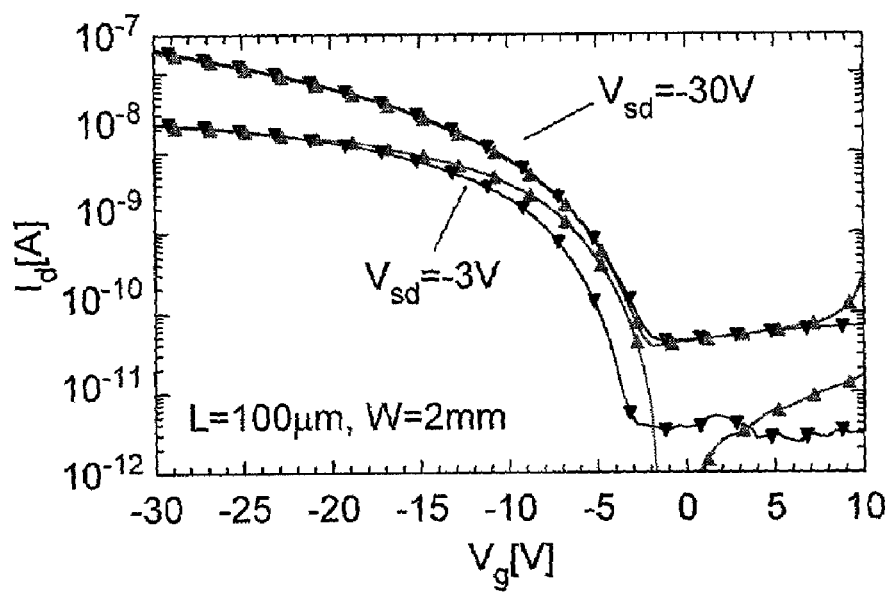
FIG. 5 shows transfer characteristics of F8T2 all-polymer TFTs as in FIG. 1(a) with a TFB (a) and polystyrene (b) diffusion barrier and a PVP surface modification layer.
Figure 5:
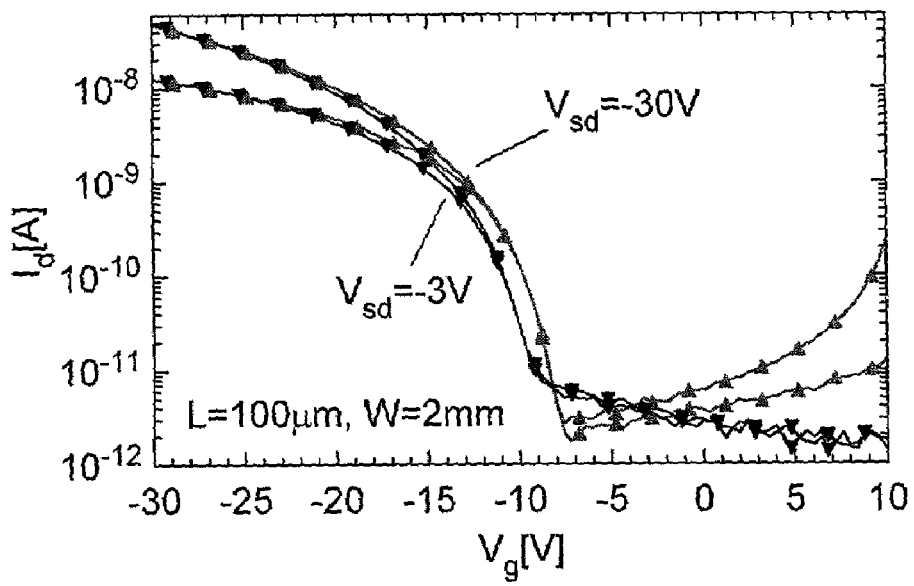

Devices have been fabricated with a broad range of non-polar diffusion barrier layers, such as F8, TFB (FIG. 5(a) shows transfer characteristics), PS (FIG. 5(b) shows transfer characteristics), and F8T2. In each case clean normally-off behaviour and small hysteresis effects and threshold voltage shifts were observed, which were of the same order of magnitude as those of reference devices with gold source-drain electrodes. This supported the interpretation that insertion of a non-polar polymer below the gate electrode blocks diffusion of ionic impurities during and after the solution deposition of the gate insulating layer. This has been found to result in reproducible TFT threshold voltages and good operating stability.

Normally-off devices containing a diffusion barrier are preferred compared to the depletion-type device described above, since it is expected that the former exhibit better long term threshold voltage stability and better lifetime due to suppression of ionic diffusion.

For the semiconducting layer any solution processible conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are reviewed for example in H. E. Katz, J. Mater. Chem. 7, 369 (1997), or Z. Bao, Advanced Materials 12, 227 (2000).

One of the important requirements to fabricate printed TFTs with good stability and high ON-OFF current ratio is good stability of the semiconducting material against unintentional doping by atmospheric oxygen and water during the processing and printing steps. Printed TFTs have been fabricated with a range of semiconducting polymers as the active semiconducting layer, such as F8T2 (see above), or regioregular P3HT deposited from mixed xylene solution. In the case of P3HT TFTs prepared in test device configurations under inert atmosphere the field-effect mobility of 0.05–0.1 cm$^2$/Vs is somewhat higher than in the case of F8T2. However, regioregular P3HT is unstable against doping by oxygen and/or water, resulting in an increase of the film conductivity during the printing steps in air and poor ON-OFF current ratio. This is related to the relatively low ionisation potential of P3HT, $I_p \approx 4.9$ eV. High ON-OFF current ratios of >$10^6$ have been demonstrated for P3HT, but this requires a reductive dedoping step after the deposition, such as exposure to hydrazine vapour (H. Sirringhaus, et al., Advances in Solid State Physics 39, 101 (1999)). However, on the IJP TFTs described above this reductive post-processing step cannot be performed since it would also result in dedoping of the PEDOT electrodes and reduce their conductivity significantly. Therefore, to achieve high current switching ratios it is important that a polymer semiconductor is used with good stability against unintentional doping by oxygen or water.

A preferred class of materials to achieve good environmental stability and high mobility are A-B rigid-rod blockcopolymers containing a regular ordered sequence of A and B blocks. Suitable A blocks are structurally well defined, ladder type moieties with a high band gap, that have high ionisation potentials larger than 5.5 eV as a homopolymer and good environmental stability. Examples of suitable A blocks are fluorene derivatives (U.S. Pat. No. 5,777,070), indenofluorene derivatives (S. Setavesh, Macromolecules 33, 2016 (2000)), phenylene or ladder-type phenylene derivatives (J. Grimme et al., Adv. Mat. 7, 292 (1995)). Suitable B blocks are hole-transporting moieties with lower bandgaps that contain heteroatoms such as sulphur or nitrogen, and as a homopolymer have ionisation potentials less than 5.5 eV. Examples of hole-transporting B blocks are thiophene derivatives, or triarylamine derivatives. The effect of the B block is to lower the ionisation potential of the block copolymer. The ionisation potential of the block copolymer is preferably in the range of 4.9 eV$\leq$Ip 5.5 eV. Examples of such copolymers are F8T2 (ionisation potential 5.5 eV) or TFB (U.S. Pat. No. 5,777,070).

Other suitable hole transporting polymers are homopolymers of polythiophene derivatives with ionisation potential larger than 5 eV, such as polythiophenes with alkoxy or fluorinated side chains (R. D. McCullough, Advanced Materials 10, 93 (1998)).

Instead of hole transporting semiconducting polymers soluble electron transporting materials may be used as well. These require a high electron affinity larger than 3 eV, preferably larger than 3.5 eV, to prevent residual atmospheric impurities such as oxygen to act as carrier traps. Suitable materials may include solution processible electron-transporting small molecule semiconductors (H. E. Katz et al., Nature 404, 478 (2000)), or polythiophene derivatives with electron-deficient fluorinated side chains. AB-type block copolymers with a structurally-well defined, ladder-type A block with a high ionisation potential larger than 5.5 eV and an electron-transporting B block that increases the electron affinity of the copolymer to a value higher than 3 eV, preferably higher than 3.5 eV are also suitable. Examples of A blocks are fluorene derivatives (U.S. Pat. No. 5,777,070), indenofluorene derivatives (S. Setayesh, Macromolecules 33, 2016 (2000)), phenylene or ladder-type phenylene derivatives (J. Grimme et al., Adv. Mat. 7, 292 (1995)). Examples of electron-transporting B blocks are benzothiadiazole derivatives (U.S. Pat. No. 0.5, 777,070), perylene derivatives, naphtalenetetracarboxylic diimide derivatives (H. E. Katz et al., Nature 404, 478 (2000)) or fluorinated thiophene derivatives.

For fast operation of logic circuits the channel length L of the transistors and the overlap between source/drain and gate d have to be as small as possible, that is typically a few microns. The most critical dimension is L, because the operation speed of a transistor circuit is approximately proportional to $L^{-2}$. This is particularly important for semiconducting layers with relatively low mobility.

Figure 6:
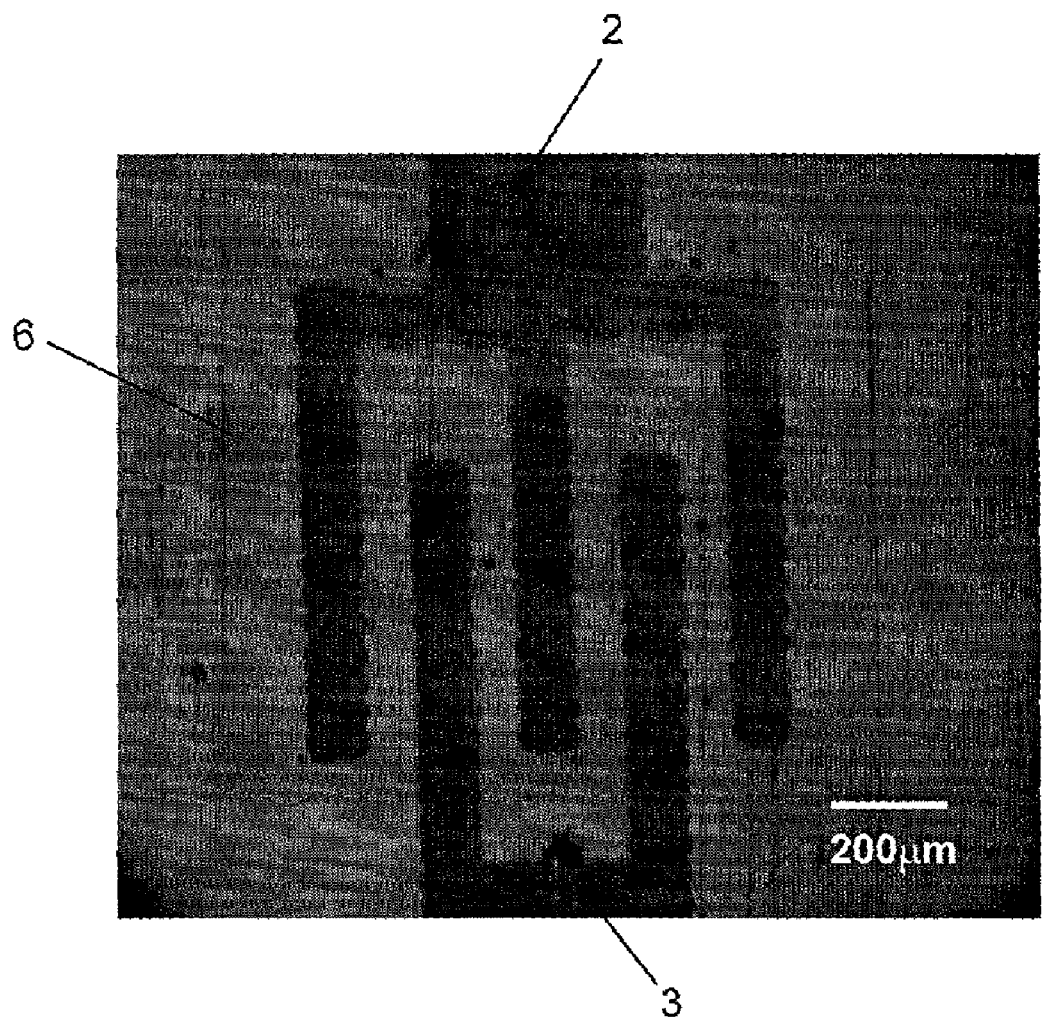
FIG. 6 shows an optical micrograph of an all-polymer TFT according to FIG. 1(a) with an F8T2 active layer and source-drain electrodes printed directly onto a bare glass substrate.

Such high-resolution patterning cannot be achieved with present-day ink-jet printing technology, which is limited to feature sizes of 10–20 μm even with state-of-the-art IJP technology (FIG. 6). If faster operation and denser packing of features is required then a technique that allows finer feature resolution must be employed. The technique described below makes use of ink-surface interactions to confine ink-jet droplets on the surface of a substrate. This technique can be used to achieve much smaller channel lengths than can be achieved by conventional ink-jet printing.

This confinement technique can be used to permit fine-resolution deposition of a deposited material on to a substrate. The surface of the substrate is first treated in order to render selected parts of it relatively attractive and relatively repellent for the material to be deposited. For example, the substrate could be pre-patterned so as to be partially hydrophobic in some areas and partially hydrophilic in other areas. With the pre-patterning step performed at high resolution and/or precise registration the subsequent deposition can be accurately defined.

Figure 7:
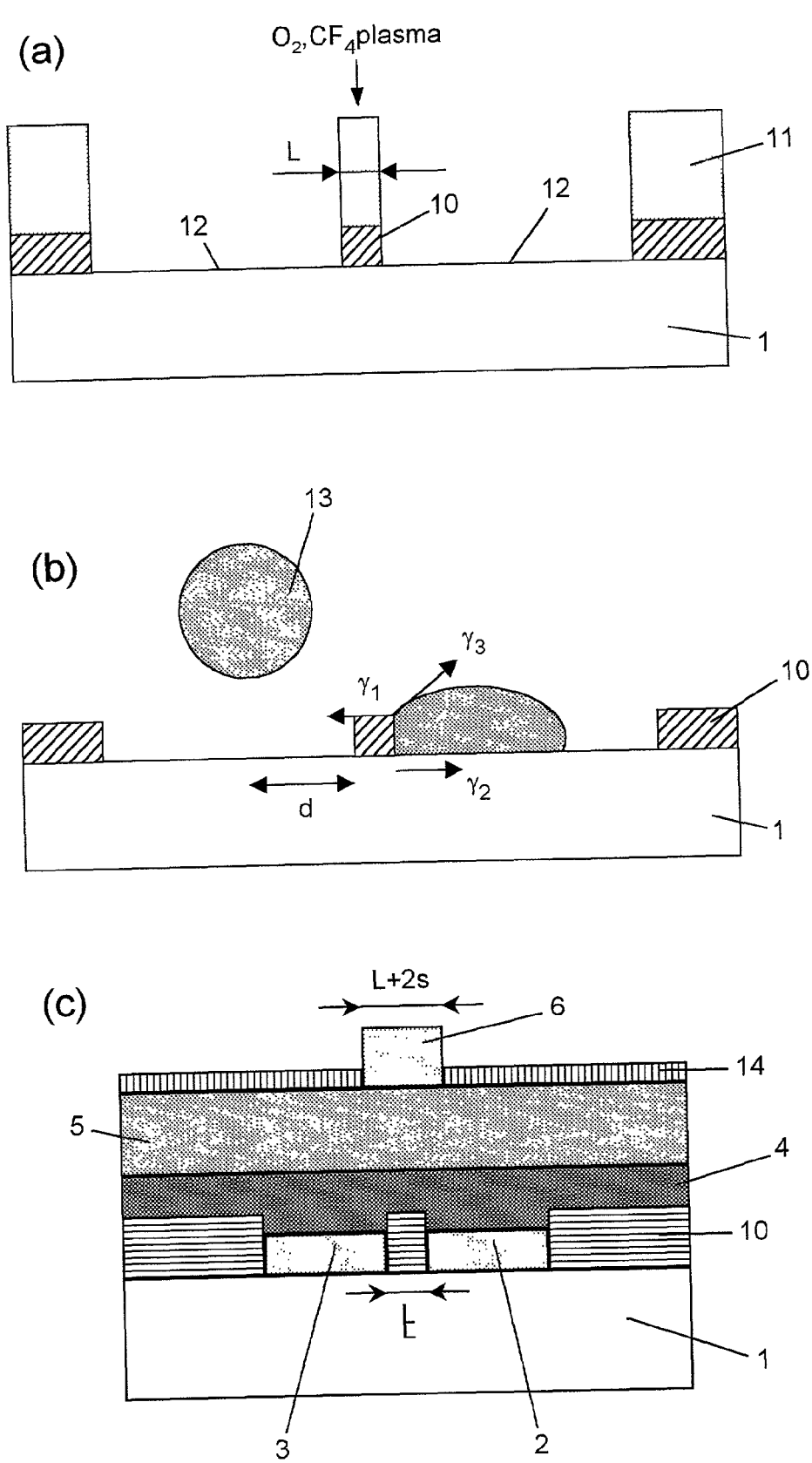
FIG. 7 shows the fabrication of TFTs with small channel length and small overlap capacitance through patterning of the substrate surface into hydrophobic and hydrophilic areas.

One embodiment of pre-patterning is illustrated in FIG. 7. FIG. 7 illustrates the formation of a device of the type shown in FIG. 1(c) but with an especially fine channel length L. Like parts are numbered as for FIG. 1(c). FIG. 7(a) illustrates a method to fabricate a pre-patterned substrate. FIG. 7(b) illustrates printing and ink confinement on a pre-patterned substrate.

Prior to the deposition of the source-drain electrodes 2, 3 a thin polyimide layer 10 is formed over the glass sheet 1. This polyimide layer is finely patterned to remove it in the places in which the source-drain electrodes are to be formed. The removal step may be done by a photolithographic process to allow fine feature definition and/or accurate registration. In one example of such a process the polyimide may be covered with a layer of photoresist 11. The photoresist can be patterned photolithographically to remove it in the places where the polyimide is to be removed. Next the polyimide is removed by a process to which the photoresist is resistant. Then the photoresist can be removed to leave the accurately patterned polyimide. Polyimide is selected because it is relatively hydrophobic, whereas the glass substrate is relatively hydrophilic. In the next step PEDOT material to form the source-drain electrodes is deposited by ink-jet printing onto the hydrophilic substrate areas 12. When ink droplets spreading on the glass substrate areas hit the boundary of a hydrophobic polyimide region 10 the ink is repelled and prevented from flowing into the hydrophobic surface areas.

Through this confinement effect the ink is deposited in the hydrophilic surface areas only and high-resolution patterns with small gaps and transistor channel lengths of less than 10 µm can be defined (FIG. 7(*b*)).

One example of a process by which the polyimide may be removed, or which may be employed to enhance the relative surface effects after removal of polyimide, is illustrated in FIG. 7(*a*). The polyimide layer 10 and the photoresist 11 are exposed to an oxygen plasma. The oxygen plasma etches the thin (500 Å) polyimide layer faster than the thick (1.5 µm) photoresist layer. The exposed bare glass surface 12 in the area of the source-drain electrodes is made very hydrophilic by exposure to an $O_2$ plasma prior to removal of the photoresist. Note that during the removal of polyimide the surface of the polyimide is protected by the photoresist and remains hydrophobic.

If required the polyimide surface can be made even more hydrophobic by an additional exposure to a $CF_4$ plasma. $CF_4$ plasma fluorinates the polyimide surface, but does not interact with the hydrophilic glass substrate. This additional plasma treatment may be performed prior to removal of the photoresist, in which case only the side walls of the polyimide pattern 10 become fluorinated, or after removal of the resist.

The contact angle of PEDOT/PSS in water on $O_2$ plasma-treated 7059 glass is $\theta_{glass} \approx 20°$ compared to a contact angle of $\theta_{PI} \approx 70°–80°$ on the polyimide surface. The contact angle of PEDOT/PSS in water on fluorinated polyimide is 120°.

When PEDOT/PSS is deposited from a water solution onto the pre-patterned polyimide layer as described, the PEDOT/PSS ink is confined to the source-drain electrode areas even if the channel length L is only a few microns (FIG. 7(*b*)).

To facilitate the confinement of ink droplets the kinetic energy of ink droplets is kept as small as possible. The larger the size of the droplets, the larger the kinetic energy, and the larger the probability that the spreading droplets will 'ignore' the hydrophilic confinement structure and spill over into neighbouring hydrophilic regions.

Preferably deposition of the ink droplets 13 is onto the hydrophilic substrate areas 12 at a distance d between the centre of the droplet and the polyimide boundary. On one hand d needs to be sufficiently small that the boundary is reached by the spreading ink and the PEDOT film extends all the way to the polyimide boundary. On the other hand, d needs to be sufficiently large that the rapidly spreading ink does not "spill over" into the hydrophobic surface areas. This would increase the risk of PEDOT deposition on top of the polyimide region 10 defining the TFT channel and may give rise to short circuits between source and drain electrodes. For PEDOT droplets with a solid content of 0.4 ng deposited with a lateral pitch of 12.5 µm between two successive droplets onto $O_2$ plasma treated 7059 glass a value of d≈30–40 µm was found suitable. The optimum value d depends on the wetting properties on the surface as well as on the deposition pitch, that is the lateral distance between subsequently deposited droplets, the frequency, with which droplets are deposited, and the drying time of the solution.

The hydrophobic confinement layer to define the channel length of the transistor may also provide a second functionality. It may be used as an aligning template for the subsequent deposition of the semiconducting polymer in the channel of the transistor. The polyimide layer 10 may be mechanically rubbed or photoaligned and can then be used as an alignment layer 9 (FIG. 1(*b*)) to provide monodomain alignment of a liquid-crystalline semiconducting polymers 4.

The gate electrode 6 may be similarly confined by a patterned layer 14 formed on top of the gate insulating layer 5 that provides attractive and repelling surface areas for the solution from which the gate electrode is deposited. The patterned layer 6 may be aligned with respect to the source-drain pattern to minimize the overlap area between sourceldrain and gate electrodes (FIG. 7(*c*).

Materials other than polyimide may be used for the pre-patterned layer. Other accurate pre-patterning techniques than photolithography may be used.

Figure 8:
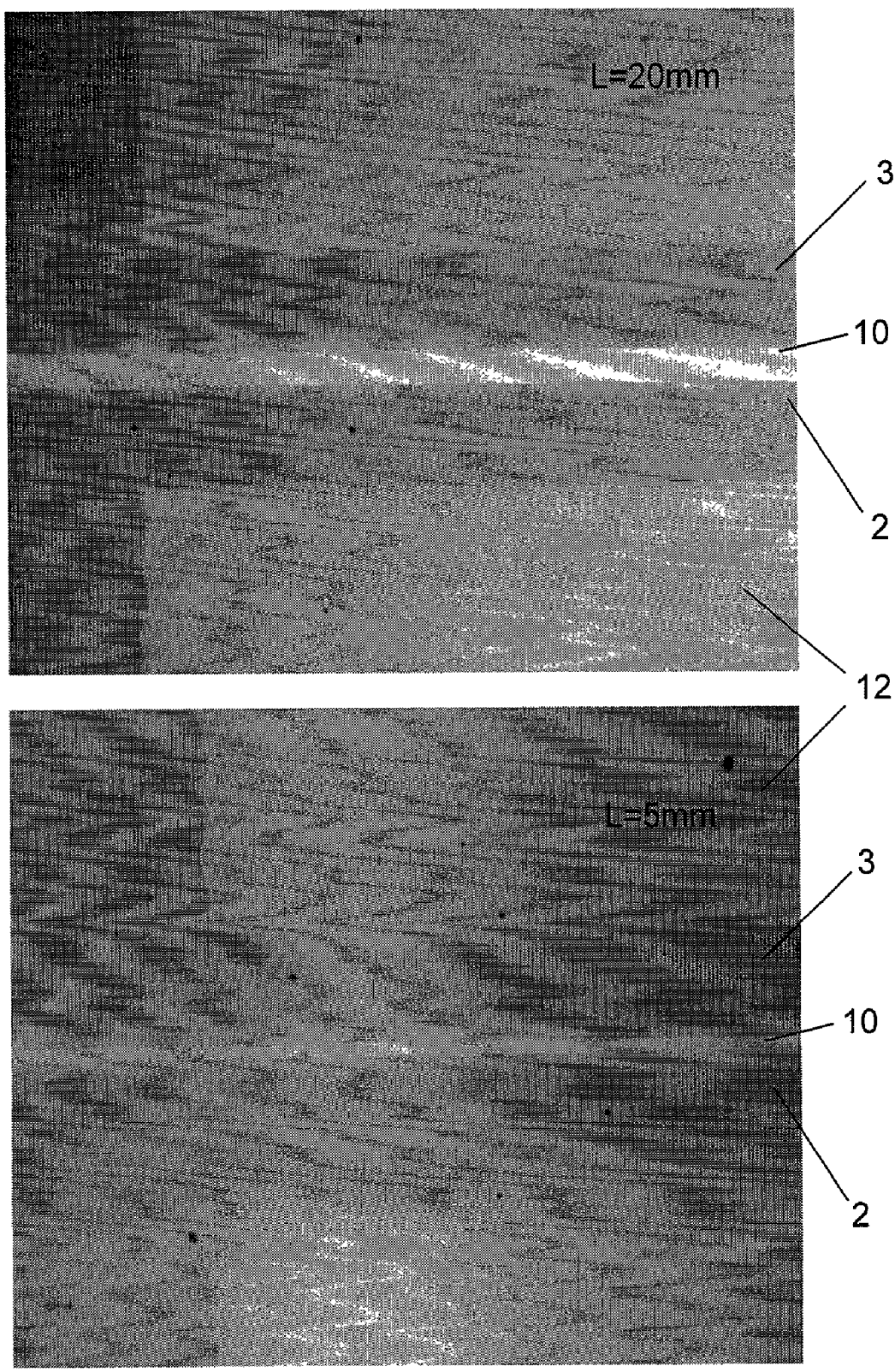
FIG. 8 shows optical micrographs of the channel region of transistors with L=20 µm (a) and L=5 µm (b) after IJP deposition of PEDOT/PSS source/drain electrodes in the vicinity of a hydrophobic polyimide bank.

FIG. 8 demonstrates the ability of a structure of relatively hydrophobic and hydrophilic layers to confine liquid "ink" deposited by ink-jet printing. FIG. 8 shows optical micrographs of substrates including thin strips of polyimide 10 that have been treated as described above to be relatively hydrophobic and larger regions of the bare glass substrate 12 that have been treated as described above to be relatively hydrophilic. PEDOT material for the source and drain electrodes has been deposited by ink-jet printing of a series of droplets running in lines 2 and 3 close to the strips 10. Although the ink-jetted material shows low contrast it can be seen from the abruptly terminated form of the end surfaces 2 and 3 of the deposited material that the deposited material has been confined by the strips 10, even down to a strip thickness of L=5 µm.

Figure 9:
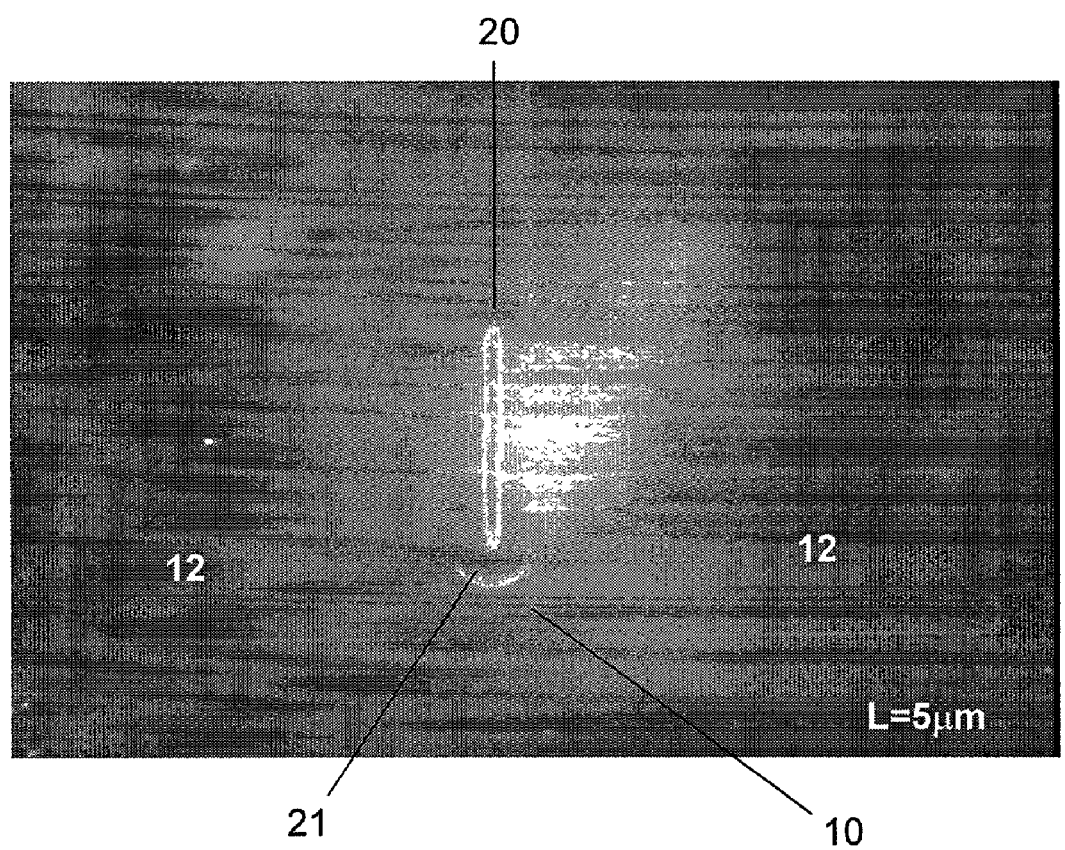
FIG. 9 shows optical micrographs taken during the deposition of ink droplets in the vicinity of a polyimide bank.

FIG. 9 shows photographs of the ink jet deposition process in the vicinity of a polyimide strip 10. The images were taken with a stroboscopic camera mounted underneath the transparent substrate. The edges of the polyimide pattern 10 can be seen as white lines. The ink droplets 21 are ejected from the nozzle of the ink jet head 20 and land with their centre being a distance d away from the polyimide strip 10. Images such as this can be used for precise local alignment of the ink-jet deposition with respect to the strip pattern 10, and may also used to automate the local alignment procedure using pattern recognition (see below).

Figure 10:
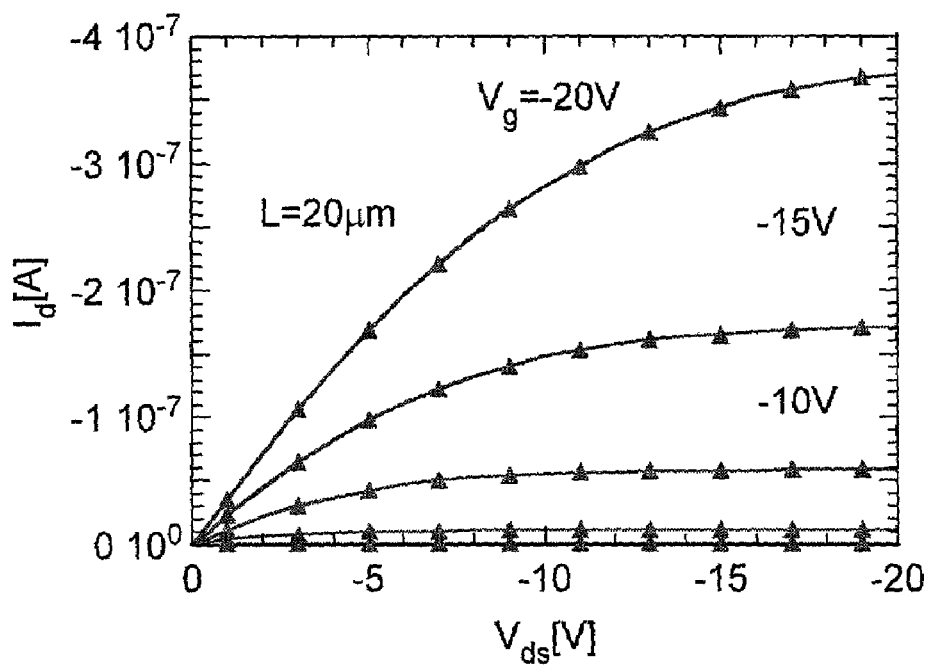
FIGS. 10 and 11 show output and transfer characteristics of transistors formed as in FIG. 7(c) and having channel lengths L=20 μm and 7 μm respectively.
Figure 10:
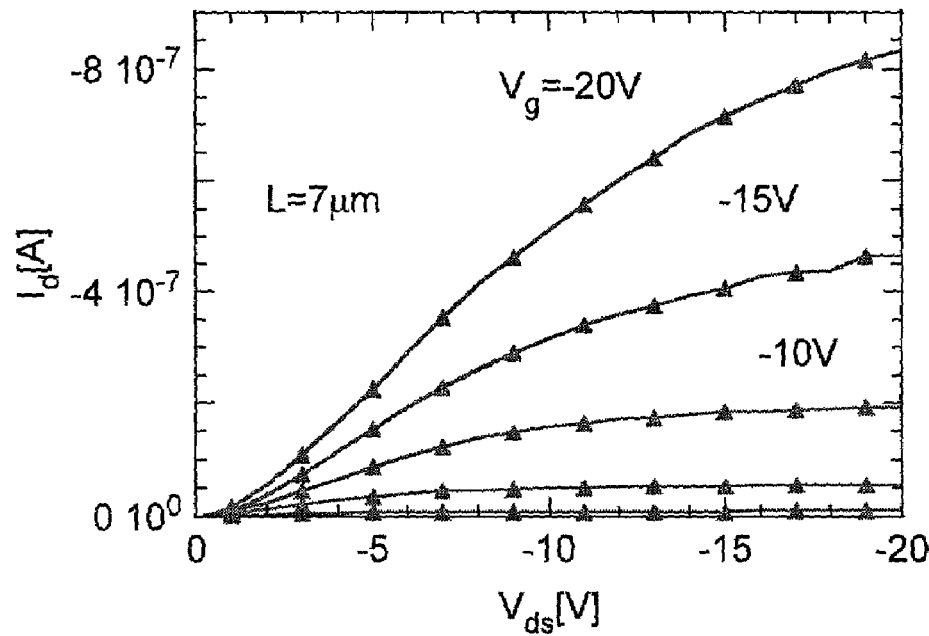
Figure 11:
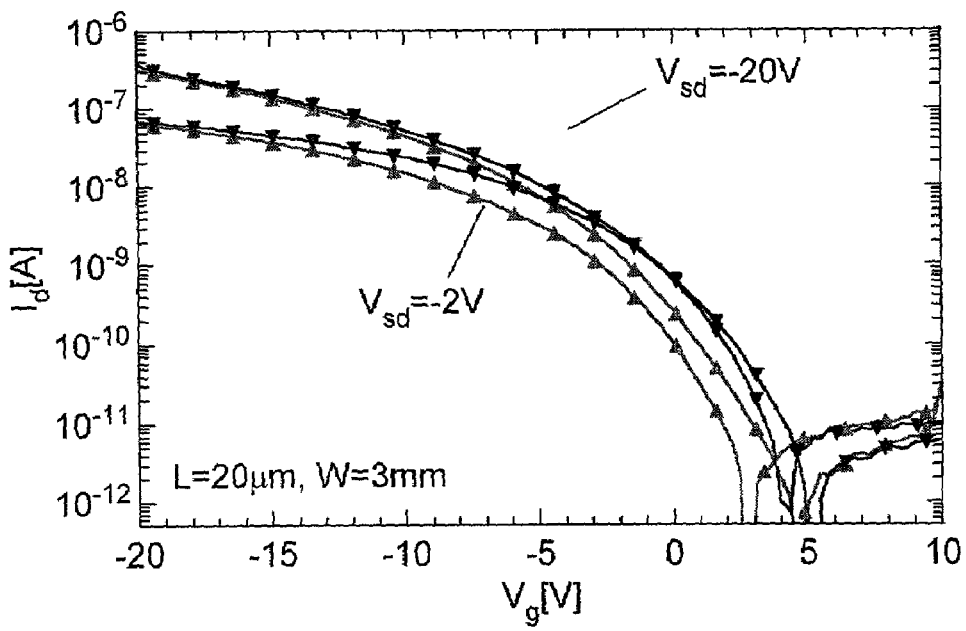
Figure 11:
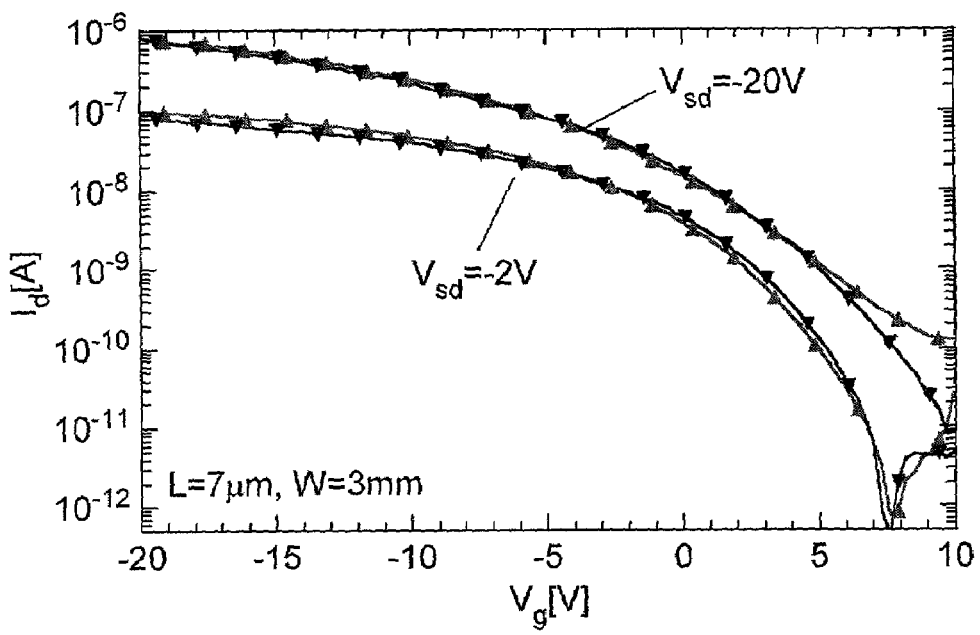

FIGS. 10 and 11 show output and transfer characteristics of transistors formed as in FIG. 7(*c*) and having channel lengths L of 20 µm and 7 µm respectively, defined by means of the differential wetting process described above. In both cases the channel width W is 3 mm. FIG. 10(*a*) shows output characteristics of the 20 µm device. FIG. 10(*b*) shows output characteristics of the 7 µm device. FIG. 11(*a*) shows transfer characteristics of the 20 µm device. FIG. 11(*b*) shows transfer characteristics of the 7 µm device. The 7 µm device shows characteristic short channel behaviour with reduced current at small source-drain voltage and finite output conductance in the saturation regime. The mobility and ON-OFF current ratio of short channel devices is similar to that of the long channel devices discussed above, that is $\mu=0.005–0.01$ cm$^2$/Vs, and $I_{ON}/I_{OFF}=10^4–10^5$.

Ink confinement is a result of the difference in wetting properties on the hydrophobic and hydrophilic surfaces, and does not require the existence of a topographic profile. In the above embodiment the polyimide film can be made very thin (500 Å), that is much thinner than the size of the inkjet droplets in the liquid state (several micrometers). Therefore, alternative techniques to fabricate a substrate pre-pattern can be used, such as the functionalization of the surface of the glass substrate with a patterned self-assembled monolayer (SAM), for example a SAM containing hydrophobic alkyl or fluorogroups such as trifluoropropyl-trimethoxysilane or polar groups such as alkoxy groups. The SAM can be patterned by suitable techniques such as UV light exposure through a shadow mask (H. Sugimura et al., Langmuir 2000, 885 (2000)) or microcontact printing (Brittain et al., Physics World May 1998, p. 31).

Pre-patterning of the substrate is readily compatible with the process flow described above as the pre-patterning is performed prior to the deposition of the layers of the TFT. Therefore, a broad range of patterning and printing techniques can be used to generate the high-resolution pre-pattern without risking degradation of the active polymer layers.

Similar techniques can be applied to pre-pattern the surface of the gate insulating layer or the surface modification layer prior to the deposition of the gate electrode to achieve small overlap capacitance. As shown in FIG. 7(c) the gate electrode 6 may be confined by a patterned layer 14. One possible embodiment of such pre-patterning is microcontact printing or UV photopatterning of a self-assembled monolayer (SAM) containing chlorosilane or methoxy silane groups, such as octadecyltrichlorosilane. These molecules form stable monolayers on the surface of a $SiO_2$ or glass substrate where they chemically bond to the hydroxyl groups on the polar surface, and render the surface hydrophobic. We found that it is possible to form similar monolayers on the surface of the gate dielectric polymer such as PVP or PMMA. This is believed to be due to bonding of the molecules to the hydroxyl groups on the PVP surface. A surface free energy pattern consisting of a fine hydrophilic line with a well-defined small overlap with the source-drain electrodes surrounded by SAM-coated, hydrophobic regions can easily be defined by soft lithographic stamping. The stamping may be performed under an optical microscope or a mask aligner in order to align the stamp pattern with respect to the underlying source-drain electrodes. When a conducting, water-based polymer ink is deposited on top the deposition is confined to the fine, hydrophilic line defined by the self-assembled monolayer. In this way a smaller linewidth can be achieved than the normal linewidth on an unpatterned gate dielectric layer. This results in a reduction of source/drain-to-gate overlap capacitance.

With the help of pre-patterned substrates it is possible to fabricate high-speed logic circuits based on the TFT and via-hole fabrication process described herein.

One of the crucial requirements for the fabrication of transistor circuits over large areas is the registration and alignment of the deposition with respect to the pattern on the substrate. Achieving adequate registration is particularly difficult on flexible substrates that exhibit distortions over large areas. If between subsequent patterning steps the substrate distorts, the next mask level in a photolithographic process will no longer overlap with the underlying pattern. The high-resolution inkjet printing process developed here is suitable to achieve accurate registration over large areas even on a plastic substrates, since the position of the ink jet head can be adjusted locally with respect to the pattern on the substrate (FIG. 9). This local alignment process can be automated using pattern recognition techniques using images such as that of FIG. 9 combined with a feedback mechanism to correct the position of the inkjet head.

In order to form a multi-transistor integrated circuit using devices of the type described above, it is desirable to be able to make via hole interconnects directly through the thickness of the device. This can allow such circuits to be formed especially compactly. One method of making such interconnects is by the use of solvent-formed via holes, as will now be described. The method takes advantage of the fact that none of the solution-processed layers of the TFTs described above has been converted into an insoluble form. This allows the opening of via-holes by local deposition of solvents.

Figure 12:
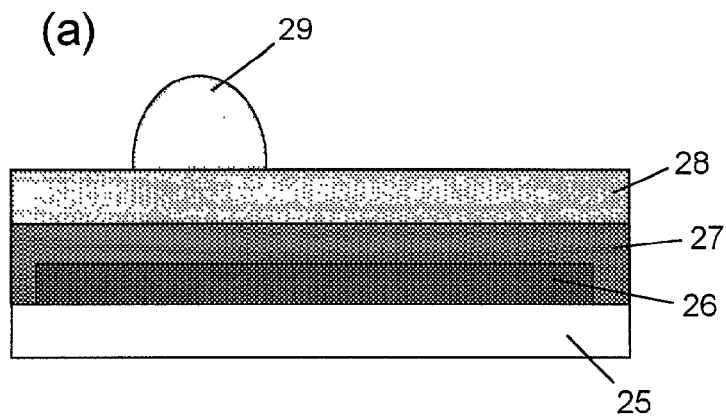
FIG. 12 shows a schematic diagram (a) Dektak profilometry and optical micrographs (b) of the process of forming via holes by successive deposition of methanol droplets onto a 1.3 μm thick PVP gate dielectric layer and (c) dependence of the via-hole outer and inner diameter on the diameter of the inkjet droplets and the thickness of the PVP layer.
Figure 12:
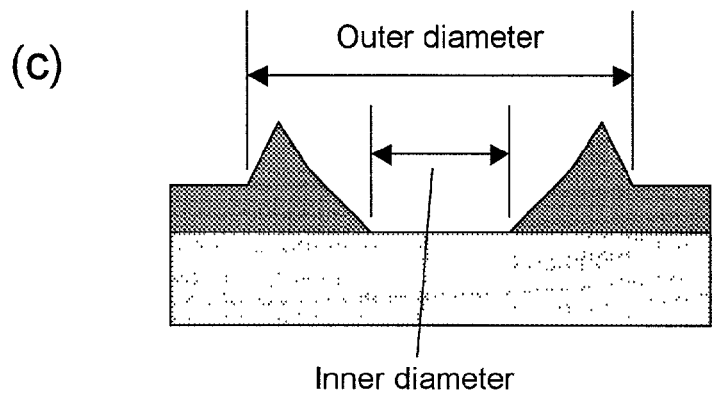
Figure 12:
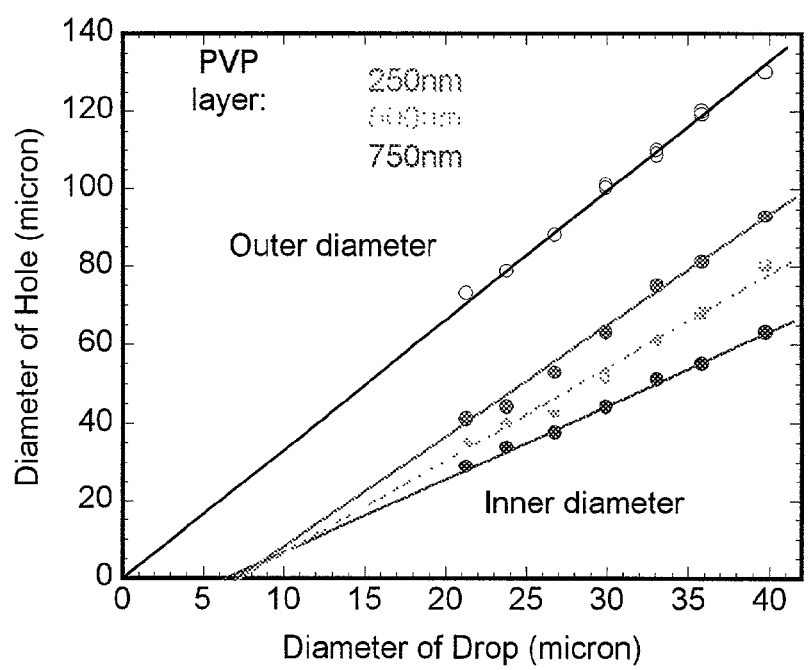
Figure 12:
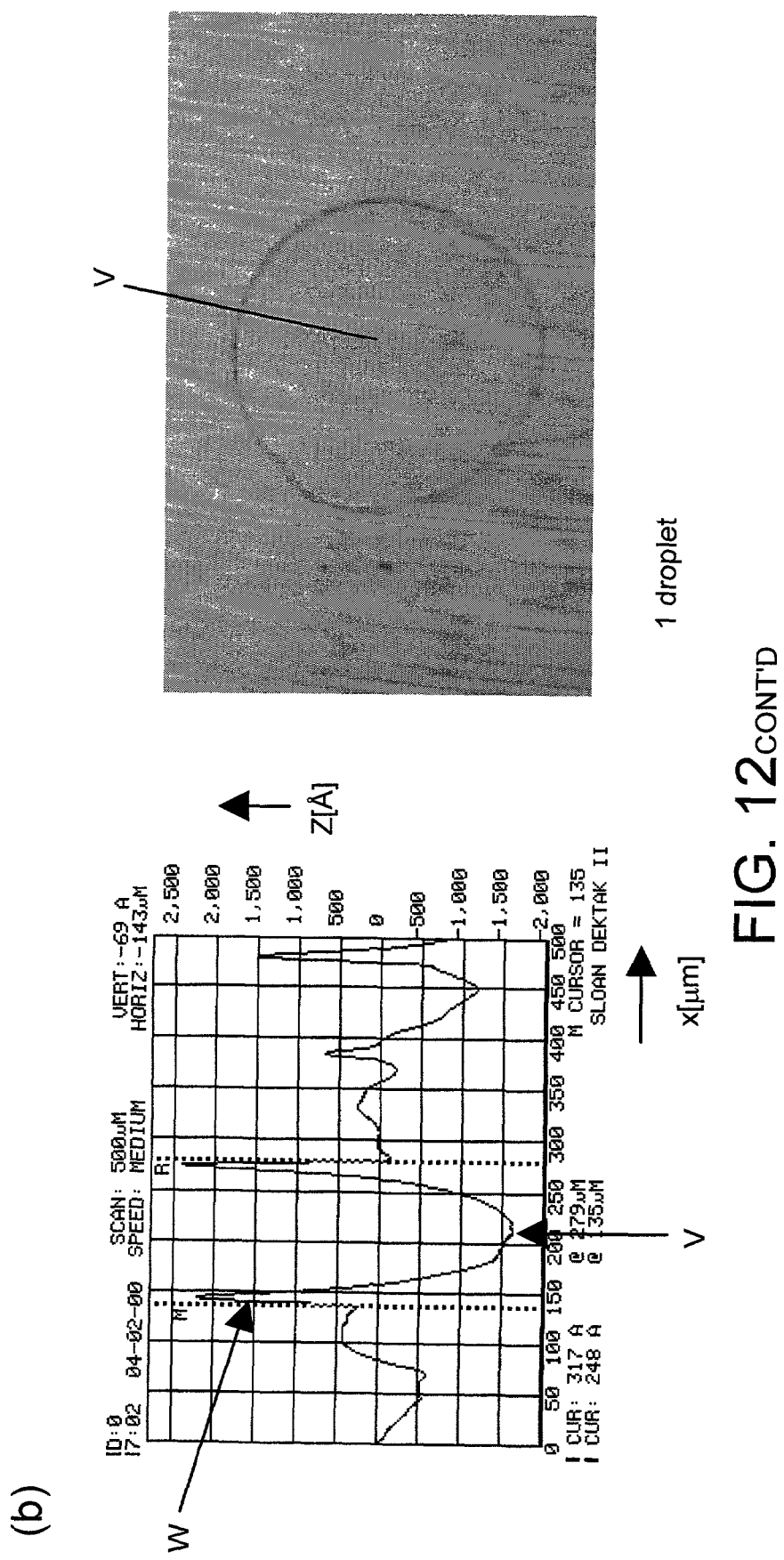
Figure 12:
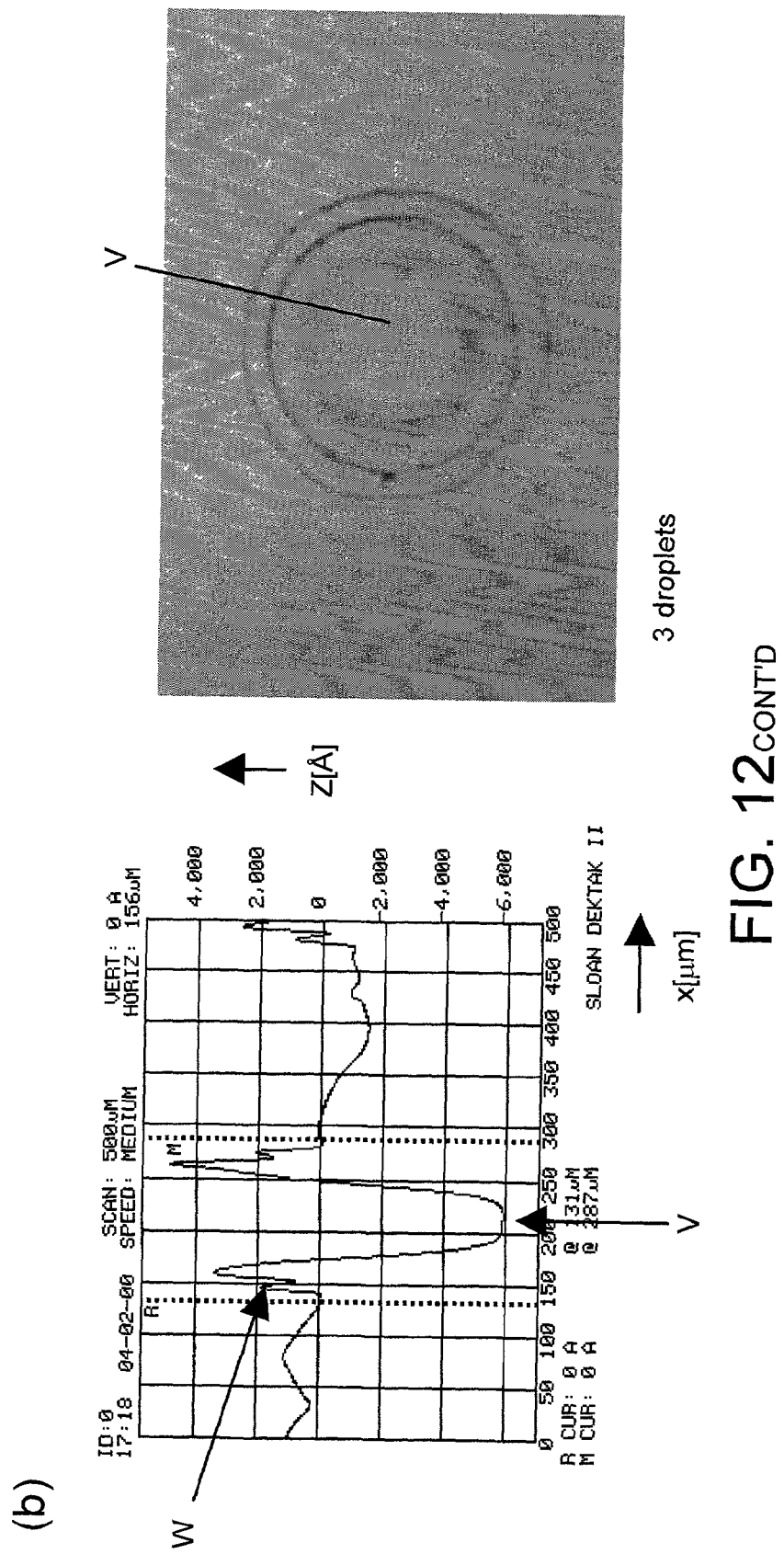
Figure 12:
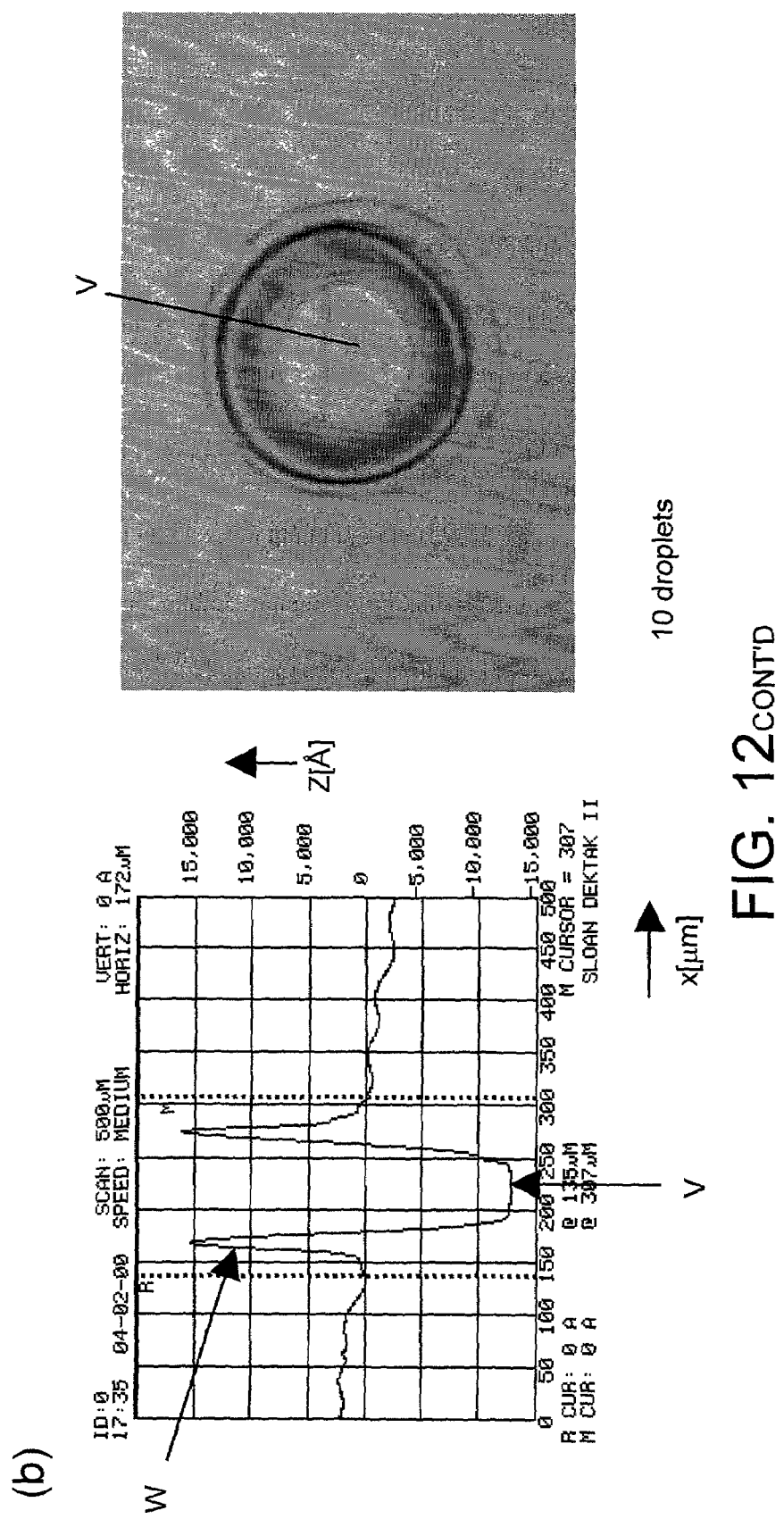

In order to make a solvent-formed via hole (FIG. 12(a)), a quantity of a suitable solvent 29 is deposited locally on top of the layers through which the via hole is to be formed. The solvent is selected so that it is capable of dissolving the underlying layers through which the hole is to be formed. The solvent sinks through the layers by progressive dissolution until the via hole is formed. The dissolved material is deposited onto the side walls W of the via-hole. The type of solvent and the method of depositing it may be selected for individual applications. However, three preferred aspects are:

1. that the solvent and the process conditions are such that the solvent evaporates or is otherwise readily removed so that it does not interfere with subsequent processing and does not cause excessive or inaccurate dissolution of the device; and
2. that the solvent is deposited by a selective process such as IJP, whereby accurately controlled volumes of the solvent may be applied accurately to the desired location on the substrate; and
3. that the diameter of the via hole is affected by the surface tension of the solvent droplet and the ability of the solvent to wet the substrate; and
4. that the solvent does not dissolve the underlying layer to which an electrical connection is to be made.

FIG. 12(a) illustrates the deposition of a droplet 29 of methanol solvent (containing 20 ng per droplet) on a partially formed transistor device of the general type illustrated in FIG. 1(c). The partial device of FIG. 12(a) includes a 1.3 µm thick PVP insulating layer 28, an F8T2 semiconducting layer 27, a PEDOT electrode layer 26 and a glass substrate 25. In this example it is desired to form a via hole through the insulating PVP layer. Methanol is selected as the solvent because of its ability to readily dissolve PVP; because it can easily evaporate so as not to hinder subsequent processing; and because it has satisfactory wetting properties for PVP. In order to form the via hole in this example an IJP printing head is moved to the location on the substrate at which the via hole is desired to be formed. Then the necessary number of suitably-sized droplets of methanol are dropped from the IJP head until the via is complete. The period between successive drops is selected for compatibility with the rate at which the methanol dissolves the layers of the device. It is preferred that each drop has fully or almost fully evaporated before the next drop is deposited. Note that when the via-hole reaches the bottom non-polar semiconducting layer the etching stops such that underlying layers are not removed. Other solvents such as isopropanol, ethanol, butanol or actone may also be used. To achieve high throughput it is desirable to complete the via-hole by deposition of a single solvent droplet. For a 300 nm thick film and a droplet with a volume of 30 pl and diameter of 50 µm this requires the solubility of the layer in the solvent to be higher than 1–2% weight per volume. A higher boiling point is also desirable if via-hole formation with a single droplet is required. In the case of PVP 1,2-dimenthyl-2-imidazolidinone (DMI) with a boiling point of 225° C. can be used.

FIG. 12(b) illustrates the effect of the dropping of several droplets of methanol in sequence onto the via hole location.

The right panels show micrographs of the device after 1, 3 and 10 droplets have been dropped. The left panels show Dektak surface profile measurements of the same devices across the via hole as it is formed. (The location of the via hole is indicated generally at position "V" in each panel). When several droplets are deposited in sequence onto the same location a crater opens up in the PVP film. The depth of the crater increases as successive droplets act, and after approximately 6 droplets the surface of the underlying F8T2 layer is uncovered. The dissolved PVP material is deposited in a wall W at the sides of the via-hole. The diameter of the via-hole is on the order 50 μm limited by the size of the droplet. This size is suitable for many applications such as logic circuits, and large area displays.

The via-hole diameter is determined by the size of the inkjet solvent droplets. The diameter of the hole was observed to be directly proportional to the diameter of the droplets (see FIG. 12c). The outer diameter of the side wall is determined by the size and spreading of the first droplet, and is independent of the thickness of the polymer layer that is dissolved. The inner diameter of the side wall decreases with increasing polymer thickness. For applications where even smaller holes are required, such as in high-resolution displays, even smaller droplet sizes can be used, or the substrate surface can be pre-patterned by a suitable technique to confine the droplet on the surface as described above. Other solvents may also be used.

It will be seen from the surface profile measurements that the formation of the via hole causes material to be dissolved and displaced to the edges of the via hole, where it remains after the solvent has been evaporated (indicated at W in figure 12(b)). It should be noted that the displaced material is of a smoother formation than illustrated by FIG. 12(b), the x and y axes of the surface profile plots of FIG. 12(b) being to dissimilar scales (x in units of μm, y in units of Å).

The mechanism for via-hole formation, i.e. the movement of material to the side walls, is believed to be similar to that of the well-known coffee-stain effect, which occurs if the contact line of a drying droplet containing a solute is pinned. Pinning can occur for example due to surface roughness or chemical heterogeneity. Note that deposition of a good solvent always generates surface roughness during dissolution. When the solvent evaporates, capillary flow occurs in order to replace the solvent evaporating near the contact line. More solvent is evaporating near the contact line because of the larger surface-to-bulk ratio near the contact line. The capillary flow velocity is large compared to the typical diffusion velocity, such that solute is carried to the edges of the droplet, and solute deposition occurs only near the rim, but not in the centre of the drying droplet (R. D. Deegan et al., Nature 389, 827 (1997)). Diffusion of solute would tend to favour homogeneous redeposition of the polymer over the whole area upon drying of the solvent, rather than formation of a side wall. Theory predicts that the capillary flow velocity v(r) (r: distance from centre; R; droplet radius) is proportional to $(R-r)^{-\lambda}$, where $\lambda=(\pi-2\theta_c)/(2\pi-2\theta_c)$. Therefore, v increases with increasing λ, that is decreasing contact angle $\theta_c$. Therefore, mass deposition at the edges occurs the faster the smaller the contact angle.

For the opening of via-holes it is therefore important that (a) the contact line of the initial droplet is pinned, (b) that the contact angle of the droplets on top of the polymer to be dissolved is sufficiently small, and (c) that evaporation of the solvent is sufficiently fast such that polymer solute diffusion can be neglected. In the case of IPA on PVP the contact angle is on the order of 12°, and the droplets typically dry within less than 1 s.

The smaller the contact angle, the faster will be the capillary flow velocity inside the droplet, i.e. the more reliable will be the formation of the side wall. However, on the other hand, the smaller the contact angle the larger the droplet diameter. An optimum contact angle therefore exists to achieve small diameter via-holes with well-defined side walls. To achieve a larger contact angle for a good solvent the surface of the substrate may be treated, for example with a self-assembled monolayer with a larger repellence for the solvent. The self-assembled monolayer may be patterned, such as to provide hydrophobic and hydrophilic surface regions, in order to confine the deposition of the solvent to a small area.

The depth and etch rate of the via hole can be controlled by a combination of the number of drops of solvent that are dropped, the frequency at which they are deposited, and the rate of evaporation of the solvent in comparison to the rate at which it is capable of dissolving the substrate. The environment in which the deposition takes place and the substrate temperature may influence the evaporation rate. A layer of material that is insoluble or only slowly soluble to the solvent may be used to limit the depth of dissolution.

Since the layer sequence of the TFT consists of alternating polar and non-polar layers, it is possible to choose solvents and solvent combinations such that etching stops at well defined depths.

In order to make contact through the via hole a conductive layer may be deposited over it so that it extends into the via hole and make electrical connection with the material at the bottom of the via hole. FIG. 13(a) shows a device of the type shown in FIG. 12(a) but including a gold electrode 25 formed after the making of a via hole as described above.

Figure 13:
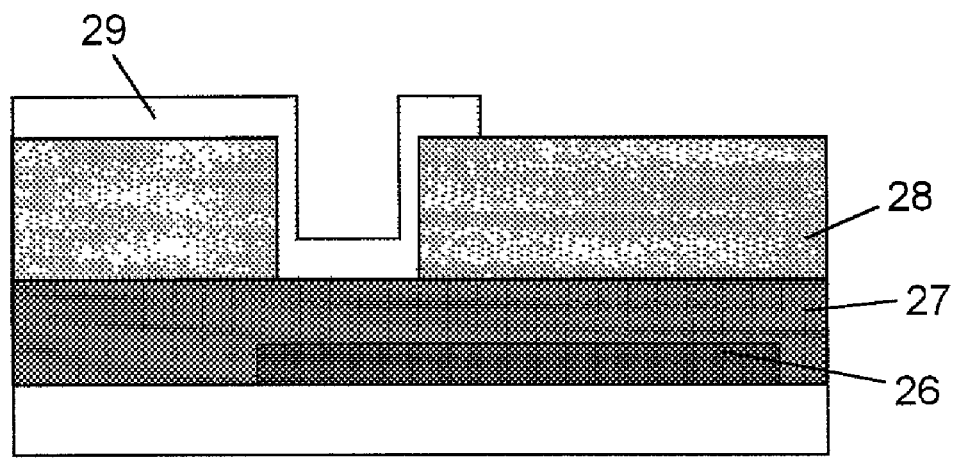
FIG. 13 shows the current-voltage characteristics through a via hole with a bottom PEDOT electrode and a top electrode.
Figure 13:
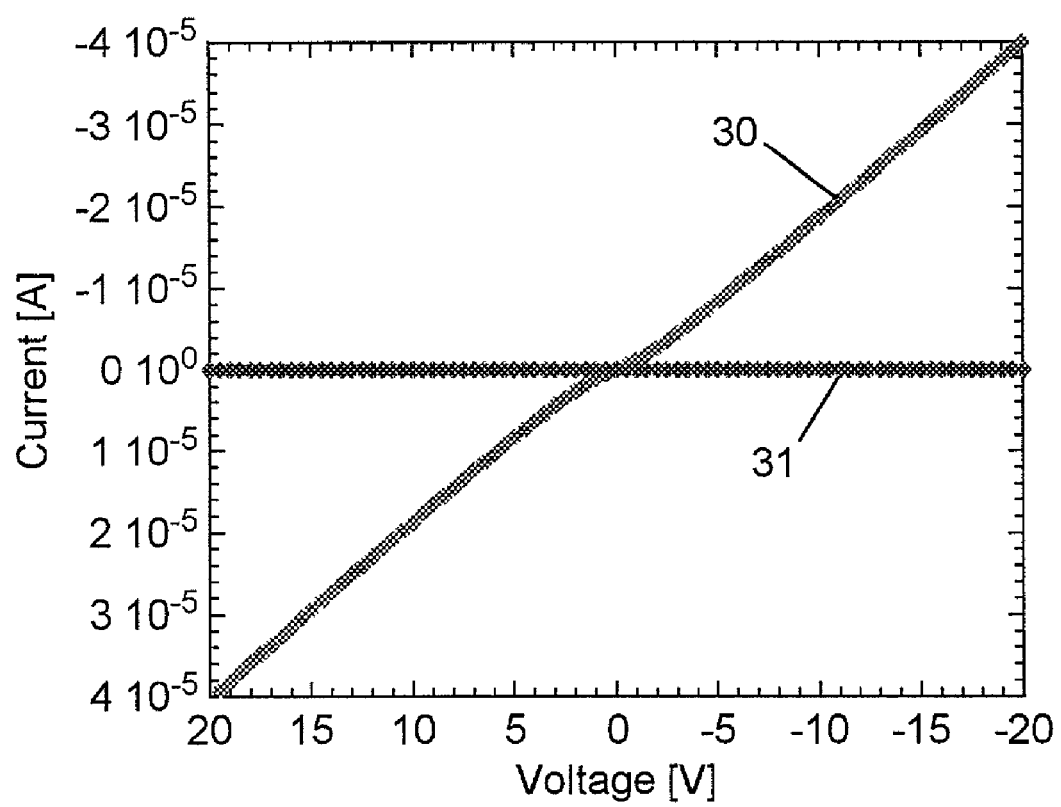

FIG. 13 shows at curve 30 the current voltage characteristics measured between the bottom PEDOT electrode 25 and a conducting electrode 29 deposited on top of the PVP gate insulating layer 28. The diameter of the via hole was 50 μm. For comparison, curve 31 shows a reference sample, in which no via-holes are located in the overlap region between the top and bottom electrodes. The characteristics clearly show that the current through the via-hole is several orders of magnitude higher than the leakage current through the gate insulator in the absence of the via hole. The measured current through the via hole is limited by the conductivity of the PEDOT electrodes, as can be seen by performing conductivity measurements of the individual PEDOT electrodes. It is not limited by the resistance of the via-hole, such that only a lower limit estimate for the via-hole resistance $R_v$ can be obtained from these measurements: $R_v<500$ kΩ.

The method of via hole formation described above in relation to FIG. 12 is directly applicable to depletion-type devices without a diffusion barrier (as in FIG. 1(c)) and to devices in which the diffusion barrier is deposited after the opening of the via-holes. FIG. 14(a) shows a device in which a via hole has been formed and the gate electrode then deposited without an intervening diffusion barrier layer. FIG. 14(b) shows a similar device in which after formation of the via hole a diffusion barrier polymer 7 has been formed before deposition of the gate electrode 6. In this case the diffusion barrier layer needs to exhibit good charge transporting properties in order to minimise the via-hole resistance $R_v$. A suitable diffusion barrier is a thin layer of TFB as shown in FIG. 5(a).

If an even lower contact resistance is required then the semiconductor layers may also be removed at the via hole site. This is preferably done after the diffusion barrier has been formed. The diffusion barrier 7 and the semiconducting polymer 4 can be locally dissolved by IJP deposition of a good solvent for them—such as xylene in this example. By mixing good solvents for both the semiconducting and the insulating material, both layers may be dissolved at the same time. A device in which this has been done followed by deposition of the gate electrode is shown in FIG. 14(c).

Mixtures of solvents can also be used to reduce the diameter of the via-hole by increasing the contact angle of the solvent mixture on the layer to be dissolved.

An alternative technique to forming a via hole interconnection and then depositing a conductive material to bridge it is to locally deposit a material that is capable of locally modifying the underlying layer(s) substrate so as to render them conductive. One example is the local IJP deposition of a solution containing a mobile dopant that is able to diffuse into one or several of the layers. This is illustrated in FIG. 14(d), where region 32 indicates material that has been rendered conductive by treatment with a dopant. The dopant may be a small conjugated molecule such as a triarylamine like N,N'-diphenyl-N,N'-bis(3-methylphenyl)-(1,1'-biphenyl)-4,4'-diamine (TPD). The dopant is preferably delivered as for the solvent case.

Figure 15:
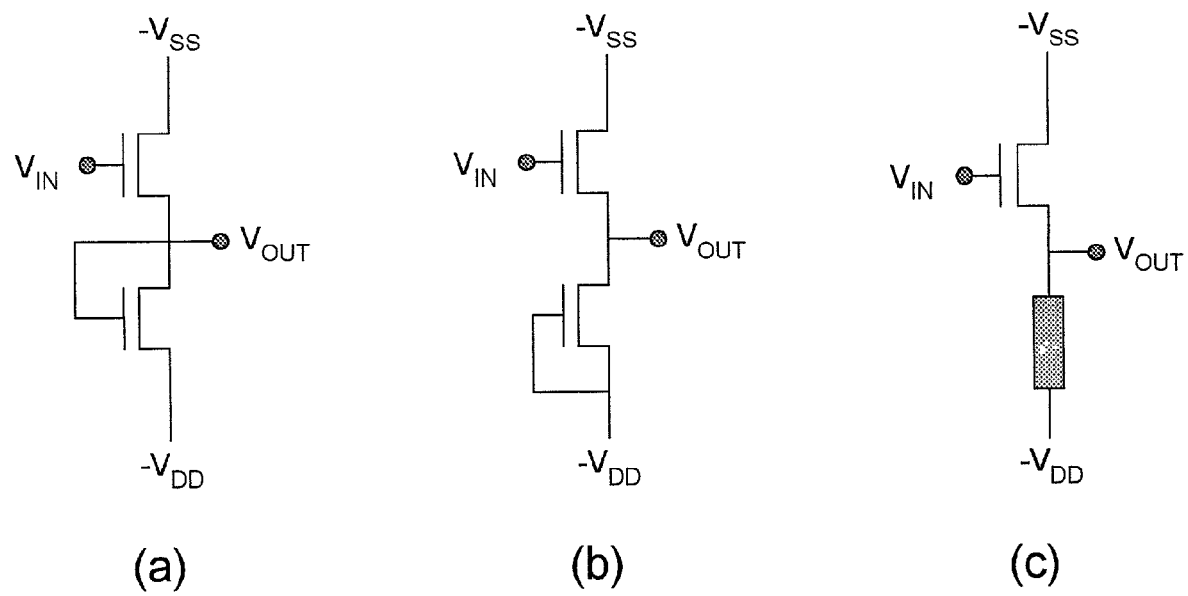
FIG. 15 shows applications of via holes such as logic inverters (depletion-load (a), enhancement-load (b) and resistance-load (c)), and multilevel interconnect schemes (d)
Figure 15:
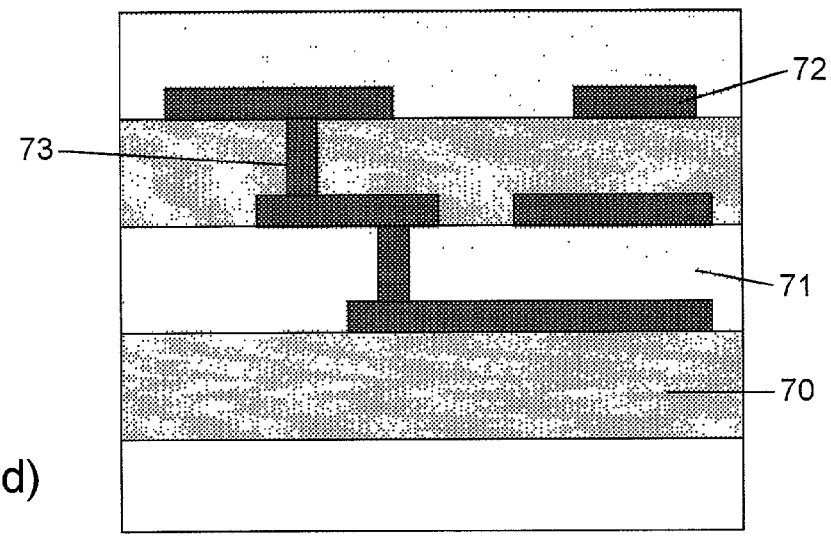
Figure 16:
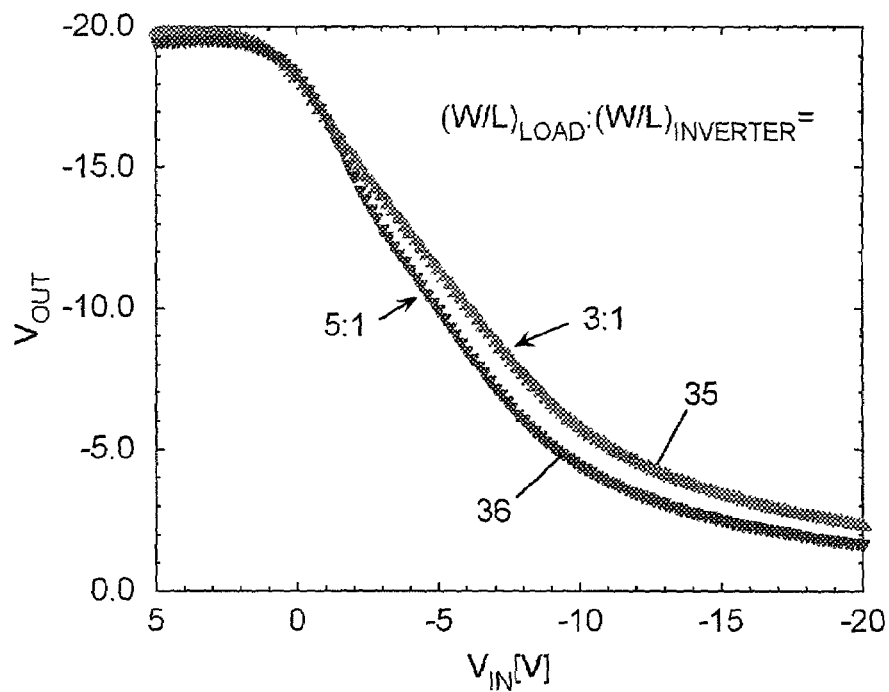
FIG. 16 shows the characteristics of enhancement-load inverter circuits as in FIG. 1(a) fabricated with printed all-polymer TFTs with different ratios of the sizes W/L of the two transistors.

The method of via-hole formation through PVP dielectric layers can be used to connect the gate electrode of the TFT to a source or drain electrode in the underlying layer as required, for example, for a logic inverter device as shown in FIG. 15. Similar via-hole connections are required in most logic transistor circuits. FIG. 16 shows plots of the characteristics of enhancement-load inverter devices formed with two normally-off transistor devices as in FIG. 15(b). Two inverters with different ratio of the channel width to channel length ratio (W/L) for the two transistors are shown (plot 35 ratio 3:1, plot 36 ratio 5:1)). It can be seen that the output voltage changes from a logic high (−20V) to a logic low (≈0V) state when the input voltage changes from logic low to logic high. The gain of the inverter, that is the maximum slope of the characteristics is larger than 1, which is a necessary condition to allow the fabrication of more complex circuits such as ring oscillators.

Via-holes as described above may also be used to provide electrical connections between interconnect lines in different layers. For complex electronic circuits multilevel interconnect schemes are required. This may be fabricated by depositing a sequence of interconnects 72 and different dielectric layers 70, 71 deposited from compatible solvents (FIG. 15(d)). Via-holes 73 can then be formed in the way described above with the interconnect lines providing automatic etch stop.

Examples for suitable dielectric materials are polar polymers (70) such as PVP and non-polar dielectric polymers (71) such as polystyrene. These can be deposited alternatively from polar and non-polar solvents. Via-holes can be opened by local deposition of good solvents for the respective dielectric layer while the underlying dielectric layer is providing an etch-stopping layer.

In selecting materials and deposition processes for devices of the type described above, it should be borne in mind that great advantages can be obtained if each layer is deposited from a solvent that does not substantially dissolve the immediately underlying layer. In this way successive layers can be built up by solution processing. One way to simplify selection of such materials and process steps is to aim to deposit two or more layers alternately from polar and non-polar solvents, as exemplified for the layer sequence described above. In this way multilayer devices containing soluble, conducting, semiconducting and insulating layers can readily be formed. This can circumvent the problems of dissolution and swelling of underlying layers.

The device structures, materials and processes described above are merely illustrative. It will be appreciated that they may be varied.

Figure 17:
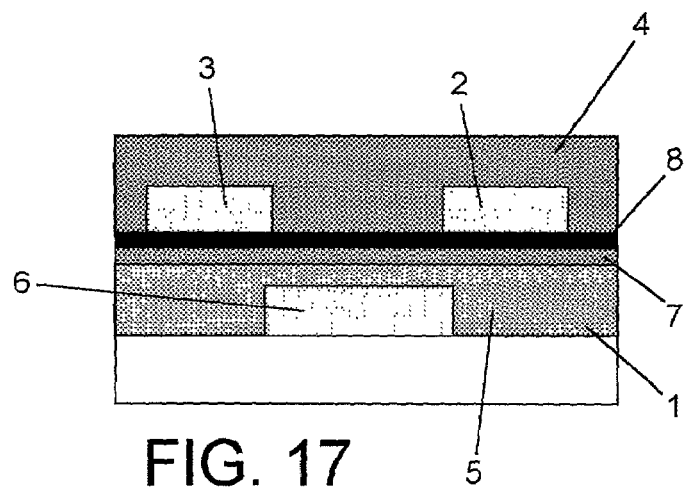
FIG. 17 shows an alternative bottom-gate device configuration.

Other device configurations than the top-gate configuration shown in FIG. 1 may be used. An alternative configuration is the more standard bottom-gate configuration shown in FIG. 17, in which it is also possible to incorporate a diffusion barrier 7 and surface modification layer 8 if required. In FIG. 17 like parts are numbered as for FIG. 1. Other device configurations with different layer sequences may also be used. Devices other than transistors may be formed in an analogous way.

PEDOT/PSS may be replaced by any conducting polymer that can be deposited from solution. Examples include polyaniline or polypyrrole. However, some of the attractive features of PEDOT/PSS are: (a) a polymeric dopant (PSS) with inherently low diffusivity, (b) good thermal stability and stability in air, and (c) a work function of ≈5.1 eV that is well matched to the ionisation potential of common hole-transporting semiconducting polymers allowing for efficient hole charge carrier injection.

Efficient charge carrier injection is crucial in particular for short-channel transistor devices with channel lengths L<10 µm. In such devices source-drain contact resistance effects may limit the TFT current for small source-drain voltages (FIG. 10(b)). In devices of comparable channel length it was found that injection from PEDOT source/drain electrodes is more efficient than injection from inorganic gold electrodes. This indicates that a polymeric source-drain electrode with an ionisation potential that is well matched to that of the semiconductor may be preferable to an inorganic electrode material.

The conductivity of PEDOT/PSS deposited from a water solution (Baytron P) is on the order of 0.1–1 S/cm. Higher conductivities up to 100 S/cm can be obtained with formulations that contain a mixture of solvents (Bayer CPP 105T, containing isopropanol and N-methyl-2-pyrrolidone (NMP)). In the latter case care needs to be taken that the solvent combination of the formulation is compatible with the solubility requirements of the layer sequence. For applications in which even higher conductivities are required other conducting polymers or solution-processible inorganic conductors, such as colloidal suspensions of metallic inorganic particles in a liquid, may be used.

The processes and devices described herein are not limited to devices fabricated with solution-processed polymers. Some of the conducting electrodes of the TFT and/or the interconnects in a circuit or display device (see below) may be formed from inorganic conductors, that can, for example, be deposited by printing of a colloidal suspension or by electroplating onto a pre-patterned substrate. In devices in which not all layers are to be deposited from solution one or more PEDOT/PSS portions of the device may be replaced with an insoluble conductive material such as a vacuum-eposited conductor.

The semiconducting layer may also be replaced by another solution-processible semiconducting material. Possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)).

The electrodes may be patterned by techniques other than ink-jet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), photolithographic patterning (see WO 99/10939) or plating, or simple dip-coating of a patterned substrate with hydrophobic and hydrophilic surface regions. Ink-jet printing is considered to be particularly suitable for large area patterning with good registration, in particular for flexible plastic substrates.

Instead of a glass sheet, the device(s) could be deposited on to another substrate material, such as Perspex or a flexible, plastic substrate such as polyethersulphone. Such a material is preferably in the form of a sheet, is preferably of a polymer material, and may be transparent and/or flexible.

Although preferably all layers and components of the device and circuit are deposited and patterned by solution processing and printing techniques, one or more components such as a semiconducting layer may also be deposited by vacuum deposition techniques and/or patterned by a photolithographic process.

Devices such as TFTs fabricated as described above may be part of a more complex circuit or device in which one or more such devices can be integrated with each other and or with other devices. Examples of applications include logic circuits and active matrix circuitry for a display or a memory device, or a user-defined gate array circuit.

The basic component of a logic circuit is the inverter shown in FIG. 15. If all transistors on the substrate are either of the depletion or of the accumulation type three possible configurations are possible. The depletion-load inverter (FIG. 15(a)) is suitable for device that are normally on, (FIG. 1(c) and 3), and the enhancement-load configuration (FIG. 15(b)) is used for normally-off transistors (FIGS. 1(a/b) and 4). Both configurations require a via-hole between the gate electrode of the load transistor and its source and drain electrode, respectively. An alternative configuration is the resistance load inverter (FIG. 15(c)). The latter device can be fabricated by printing a thin, narrow PEDOT line of adequate length and conductivity as the load resistor. By reducing the conductivity of PEDOT, for example by increasing the ratio of PSS to PEDOT, the length of the resistor line can be minimized. The conductivity of Baytron P PEDOT/PSS with a PEDOT/(PEDOT+PSS) weight ratio of 0.4 was measured to be on the order of 0.2 S/cm for an as-deposited film. By annealing to 280° C. for 20 min under $N_2$ atmosphere the conductivity increased to 2 S/cm. By diluting the solution with PSS the conductivity could be decreased by orders of magnitude. For a PEDOT/(PEDOT+PSS) weight ratio of 0.04 a conductivity of $10^{-3}$ S/cm was measured after annealing at 280° C. Resistors with a resistance of 50 MΩ were fabricated by inkjet printing a line of PEDOT with a width on the order of 60 µm and a length of 500 µm.

The different inkjet printing components that have been developed, i.e. transistors, via-hole interconnections, resistors, capacitors, multilayer interconnect schemes etc., can be integrated to fabricate integrated electronic circuits by a combination of direct printing and solution processing, Inkjet printing can be used for all processing steps where lateral patterning is required. The simple inverter circuits described above are the building blocks for more complex logic circuits.

Solution-processed TFTs as described above may be used as pixel switching transistors of active matrix displays such as liquid-crystal (LCD) or electrophoretic displays (B. Comiskey et al., Nature 394, 253 (1998)) for which a suitable circuit is shown in FIG. 18(a); and light-emitting diode displays (H. Sirringhaus, et al., Science 280, 1741 (1998), for which a suitable circuit is shown in FIG. 18(b); or as an active matrix addressing element of a memory device, such as a random access memory (RAM). In FIGS. 18(a) and (b) transistors T1 and/or T2 may be formed from transistors as described above. Features 40 represent a display or memory element with current and voltage supply pads.

Figure 19:
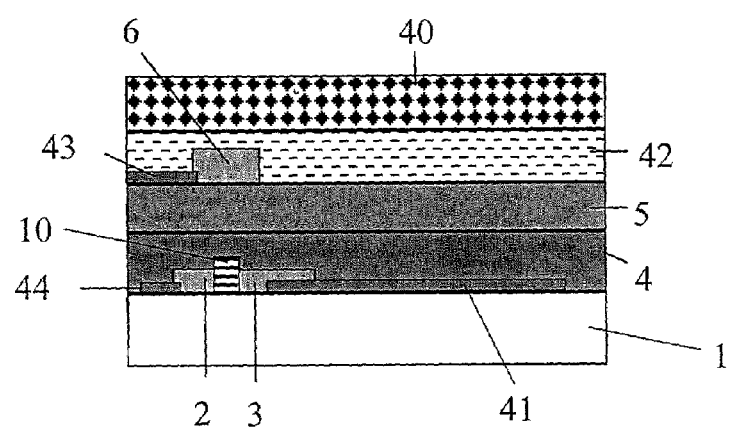
FIG. 19 shows possible configurations of the pixel of an active matrix.
Figure 19:
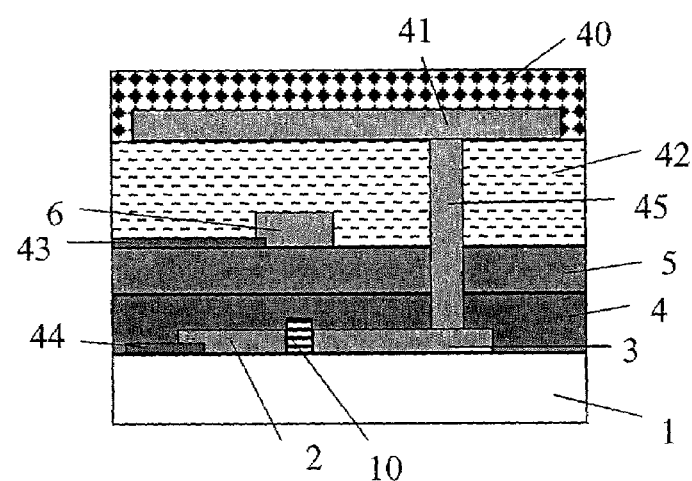
Figure 19:
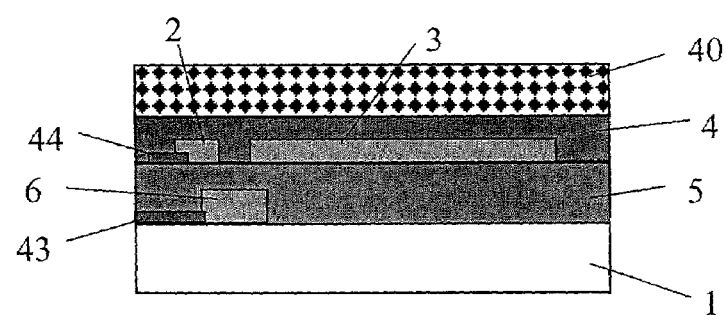

Examples of possible device configurations to control the voltage on the electrode of a LCD or an electrophoretic display are shown in FIG. 19, in which like parts are numbered as for FIG. 1. In the drawings of FIG. 19 (as for FIGS. 7, 14, and 17, for example) the gate insulating layer may include a multilayer structure containing a diffusion barrier and/or surface modification layer, as in FIG. 1(a).

Figure 18:
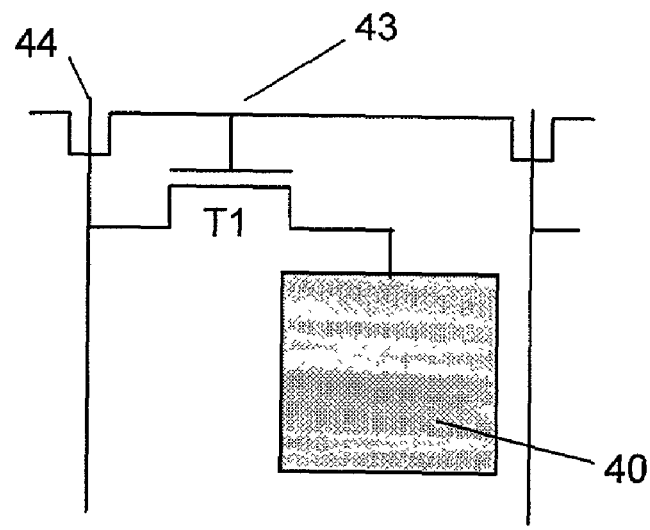
FIG. 18 shows a schematic drawing of an active matrix pixel in which the display or memory element is controlled by a voltage (a) or a current (b)
Figure 18:
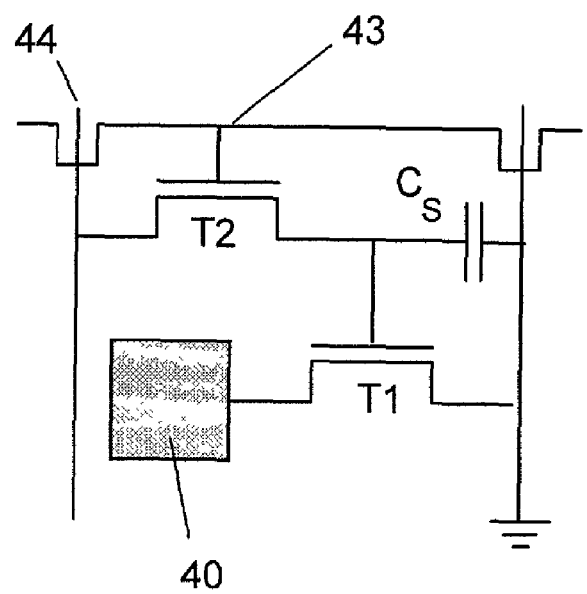

Referring to FIG. 18, the source and gate electrodes 2, 3 of the TFT are connected to the data 44 and addressing 43 lines of the active matrix, which may be fabricated from a different conducting material to achieve adequate conductivity over longer lengths. The drain electrode 3 of the TFT may also be the pixel electrode 41. The pixel electrode may be formed from a different conducting material as in FIG. 19. In devices which rely on application of an electric field rather than charge carrier injection it is not required that this electrode 41 is in direct contact display element 40, such as a liquid crystal or electrophoretic ink etc. In this configuration the total pixel area occupied by the TFT and interconnect lines has to be kept small to achieve adequate aperture ratio and to reduce potential cross-talk between the display element 40 and the signals on the data and addressing lines 43 and 44.

The configuration in FIG. 19(b) is more complicated. However, the whole pixel or a large portion of the pixel area is available for the TFTs and interconnect lines, and the display element is shielded from the signals on the data and addressing lines 44, and 43 by the pixel electrode 41. Fabrication of this configuration requires an additional dielectric layer 42 and a via-hole filled with conductive material 45 to connect the pixel electrode 41 to the TFT drain electrode 3. The via-hole can be fabricated by the procedure described above.

Figure 20:
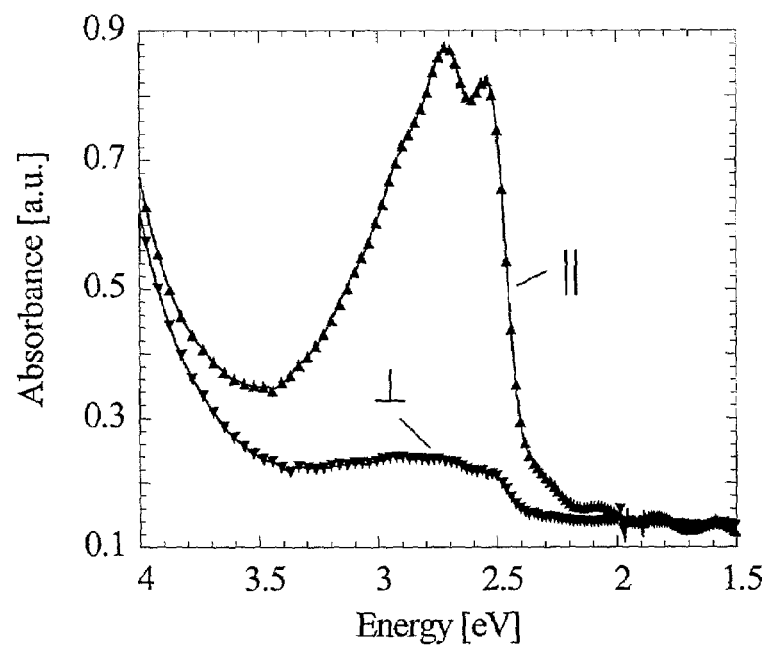
FIG. 20 shows polarized optical absorption of an aligned F8T2 TFT.

Note that in this configuration the aperture ratio can be maximized and may be approaching 100%. This configuration can also be used for display application with a backlight such as transmissive LCD displays, since all-polymer TFTs as fabricated here are highly transparent in the visible spectral range. FIG. 20 shows optical absorption spectra measured on a F8T2 polymer TFT, in which the polymer chains are aligned uniaxially by depositing the liquid-crystalline semiconducting polymer on a rubbed polyimide alignment layer which also serves as the pre-patterning layer for high-resolution printing. It can be seen that the device is highly transparent in most of the visible spectral range because of the relatively high band gap of F8T2. Even better transparency can be achieved if semiconducting layers such as F8 or TFB or other polyfluorene derivatives (U.S. Pat. No. 5,777,070) with higher band gaps are used. The alignment of the polymer chains gives rise to optical anisotropy such that light polarized parallel to the alignment direction (plot labelled "∥") is more strongly absorbed than light polarized perpendicular to the alignment direction (plot labelled "⊥"). The optical anisotropy can be used in a LCD display to further increase the optical transparency of the TFTs by orienting the alignment direction of the polymer chains normal to the polarizer between the glass backplane and the backlight. Under polarised light the transistor devices appear almost colourless in visible light, if the thickness of the F8T2 layer is below 500 Å. All the other layers of the TFT including PEDOT has low optical absorption in the visible spectral range.

Another advantage of the low optical absorption of the semiconducting layer is the reduced photosensitivity of the TFT characteristics to visible light. In the case of amorphous silicon TFTs a black matrix has to be used to prevent large OFF current under light illumination. In the case of polymer TFTs with wide band gap semiconductors it is not required to protect the TFTs from ambient light and from the backlight of the display.

The configuration in FIG. 19(b) is also well suited for the drive transistor T1 of an LED display (FIG. 18(b)), since it allows the drive current of the TFT to be increased by fabrication of an interdigitated array of source-drain electrode with large channel width W making use of the full area underneath the pixel electrode 41.

Alternatively, the bottom-gate TFT configuration of FIG. 17 can also be used in all of the above applications (FIG. 19(c)).

One of the important technological issues for the fabrication of active matrix circuits is the contact between the PEDOT/PSS TFT and pixel electrodes 2,3,6 and the metallic interconnect lines 43, 44, and 41. Due to its strong acidic nature PEDOT/PSS is not compatible with many common inorganic metals such as aluminium. Aluminium is easily oxidised in contact with PEDOT/PSS. One possible solution is the fabrication of interconnect lines and pixel electrodes 43, 44, and 41 from indium-tin-oxide (ITO) or tantalum, tungsten and other refractory metals or another material having more stability in this environment, or the use of a suitable barrier layer.

In the case of a display application it may also be desirable to fabricate TFTs with a small channel length by printing onto a pre-patterned substrate indicated as 10 in FIG. 19, as described above.

Similar device configurations for active matrix transistor switches can also be used if the pixel element to be controlled is not a display element but a memory element such as a capacitor or a diode, as for example in a dynamic random access memory.

Figure 21:
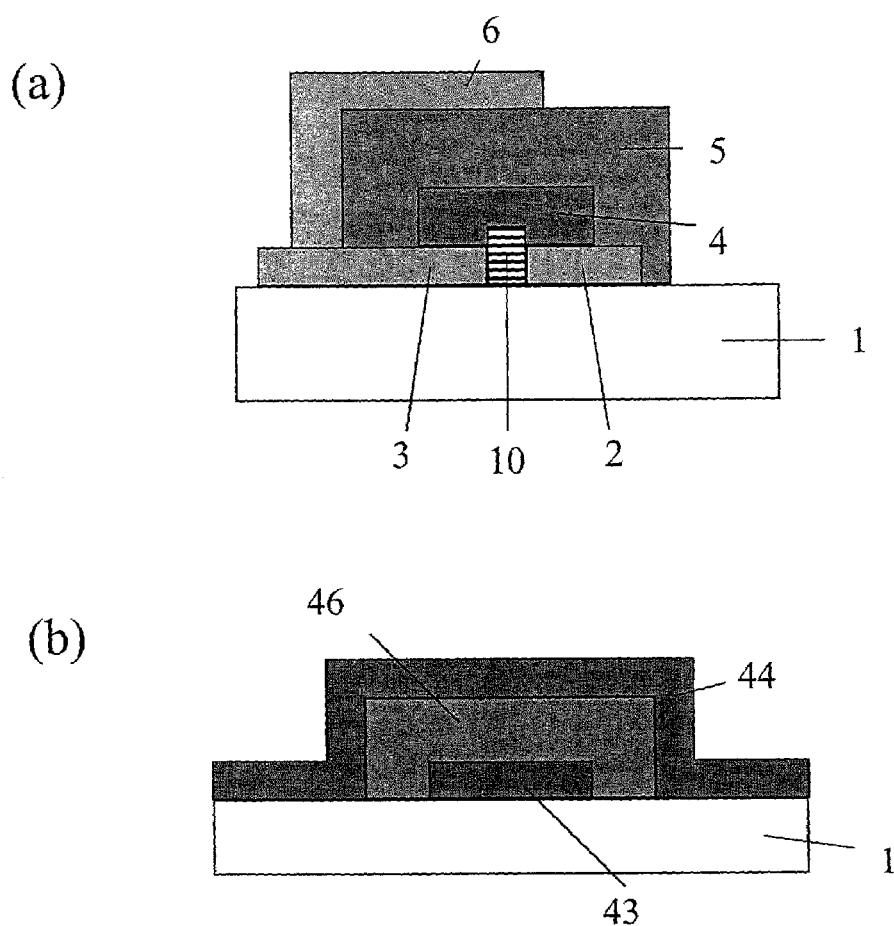
FIG. 21 shows (a) polymer TFTs with a patterned active layer island fabricated by printing of semiconducting and dielectric layers and (b) the overlap region between to conducting interconnects separated by a printed insulating island.

In addition to the conducting electrodes, some of the other layers of the TFTs may also be patterned by direct printing methods, such as screen printing or IJP. FIG. 21(a) (in which like parts are numbered as for FIG. 1) shows a device in which an active layer island of the semiconducting layer 4 and the gate insulating layer 5 may be printed directly. In this case no via-holes are required, but connections can be made by direct printing of a suitable gate electrode pattern 6. In areas where addressing or interconnect lines 43, 44 overlap thick islands of a dielectric polymer 46 may be printed to provide electrical insulation (FIG. 21(b)).

A plurality of devices formed as described above may be formed on a single substrate and interconnected by conductive layers. The devices may be formed on a single level or on more than one level, some devices being formed on top of others. By use of interconnect strips and via-holes as described above especially compact circuit arrangements may be formed.

The technology developed here for the fabrication of ink-jet printed transistors, via-holes and interconnect lines may be used to fabricate integrated electronic circuits by ink-jet printing. A prefabricated substrate containing an array of hydrophilic and hydrophobic surface regions may be used that define the channel length of the transistors and/or the width of the interconnect lines. The substrate may also contain an array of highly conducting metallic interconnect lines. Using a combination of ink-jet printing and deposition of continuous layers from solution an array of transistor devices is defined in custom locations and with custom channel widths. An integrated circuit is then fabricated by forming electrical connections between pairs of transistors and suitable interconnects using ink-jet printing of via-holes and conducting lines.

It is also possible that the prefabricated substrate may already contain one or more of the components of the transistor devices. The substrate may contain, for example, an array of completed inorganic transistor devices each having at least one exposed electrode. In this case ink-jet fabrication of an integrated circuit would comprise the formation of electrical connections between pairs of transistors and the deposition of a single- or multilevel interconnect scheme using ink-jet printed via-holes, interconnect lines, and isolation pads (see FIG. 15(d)).

In addition to transistor devices the electronic circuit may also comprise other active and passive circuit elements such as display or memory elements or capacitive or resistive elements.

Figure 22:
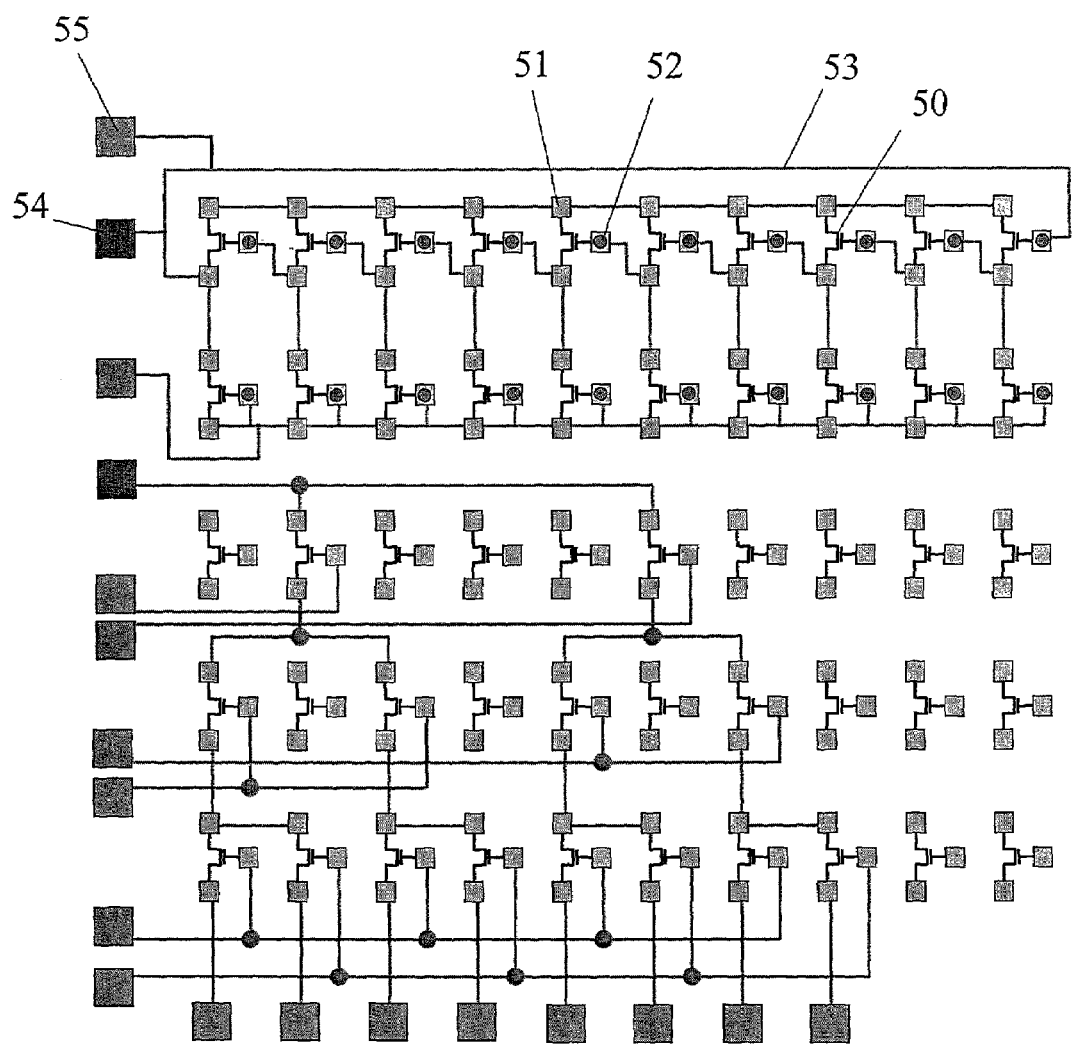
FIG. 22 shows a matrix of transistor devices connected by a network of IJP interconnects to fabricate user-defined electronic circuits.

Using the techniques described above a unit having a plurality of transistors may be formed and then configured for a specific subsequent use by means of solution-based processing. For example, a substrate having a plurality of transistors 50 of the type shown in FIG. 1(a), (b) or (c), in the form of a gate array, for example, may be formed on a plastic sheet (FIG. 22). Other devices such as diodes or capacitors may also be formed on the sheet. Then the sheet may be placed in an ink-jet printer having a printing head for a suitable solvent for forming via-holes 52 (e.g. methanol) and a suitable material for forming conductive tracks 53 and for filling via-holes (e.g. PEDOT). The ink-jet printer may be operable under the control of a suitable programmed computer, having knowledge of the location and configuration of the transistors on the sheet. Then, by a combination of via-hole formation and interconnection steps the ink-jet printer can configure the circuit for performing a desired electronic or logic function, by interconnecting the transistors in the desired way. This technology thus allows for the formation of logic-specific circuits on substrates using small, inexpensive apparatus.

Examples of the application of such a circuit are for printing of active electronic tickets, luggage and identification tags. A ticket or tag printing device may be loaded with a number of non-configured units each comprising a substrate carrying a plurality of transistors. The ticket printing device includes a computer that is capable of controlling an ink-jet printer as described above and that is capable of determining an electronic circuit that is indicative of the valid function of the ticket. When required to print a ticket the printing device configures a substrate for the appropriate electronic circuit by printing via-holes and/or conductive material so that the transistors on the substrate are appropriately configured. The substrate can then be encapsulated, for example by sealing with adhesive plastics sheet, leaving electrical connection terminals 54, 55 exposed. The ticket is then dispensed. When the ticket is to be validated, inputs are applied to one or more input terminals and the outputs of the circuit at one or more output terminals are monitored to verify its functioning. The tickets could preferably be printed on flexible plastic substrates to make them convenient for use as tickets.

User-defined circuits other than for pricing or tagging purposes may be fabricated in a similar way. Verification and reading of the circuits may also be made by remote probing using for example radio frequency radiation (Physics World March 1999, page 31).

The ability of the end-user to define circuits by simple ink-jet printing of appropriate connections onto a standard array offers significantly increased flexibility compared to factory-designed circuits.

The present invention is not limited to the foregoing examples. Aspects of the present invention include all novel and/or inventive aspects of the concepts described herein and all novel and/or inventive combinations of the features described herein.

The applicant draws attention to the fact that the present inventions may include any feature or combination of features disclosed herein either implicitly or explicitly or any generalisation thereof, without limitation to the scope of any definitions set out above. In view of the foregoing description it will be evident to a person skilled in the art that various modifications may be made within the scope of the inventions.

The invention claimed is:

1. A method for configuring a digital electronic circuit from an electronic device array comprising:
providing an electronic device array comprising a substrate and a plurality of transistors located on the substrate, each transistor having at least one interconnection electrode for allowing interconnection of the transistors; and
thereafter, defining a pattern of interconnection between at least two of the transistors by ink-jet printing conductive material on the substrate so as to provide a conductive path between two of the interconnection electrodes,
whereby a logic function of the electronic device array comprising said interconnected at least two transistors is established.

2. A method as claimed in claim 1, wherein one of the said two transistors is part of a pre-connected functional block of transistors on the substrate.

3. A method as claimed in claim 1, wherein each of the transistors is formed from polymer material.

4. A method as claimed in claim 2, wherein the polymer material comprises a conductive or semiconductive polymer.

5. A method as claimed in claim 1, wherein the substrate includes one or more passive circuit elements and the method includes the step of ink-jet printing conductive material on the substrate so as to provide a conductive path between an interconnection electrode of one of the transistors and one of the passive circuit elements.

6. A method as claimed in claim 1, wherein the substrate includes one or more further active circuit elements.

7. A method as claimed in claim 6, comprising the step of forming a display element over at least one of the transistors with an electrode of the display element in electrical connection with an electrode of one of the transistors.

8. A method as claimed in claim 1, wherein the step of ink-jet printing is performed by means of an ink-jet printer having at least on printing head operable under computer control to deposit material in a selected location on the substrate.

9. A method as claim in claim 1, wherein the step of ink-jet printing includes the steps of detecting optical contrast one the substrate, and performing processing on the basis of the contrast in order to direct the printing head under computer control to achieve good registration accuracy with respect to a previously deposited pattern.

10. A method as claimed in claim 1, wherein the ink-jet printer is operable for depositing conductive and/or insulating material in order in order to define a user-selected circuit on the substrate by means of ink-jet printing.

11. A method as claimed in claim 1, comprising ink-jet printing a solvent on to localised regions of insulating layer of the devices so as to dissolve the insulating layers in the regions to leave voids extending through the layers, and depositing electrically conductive material in the voids.

12. A method as claimed in claim 1, wherein the substrate include a structure between electrodes of the transistors for confining liquid deposited on the substrate in a pre-defined path between the electrodes by means of relative attraction and/or repellence for the liquid.

13. An electronic device formed by a method according to claim 1.

14. A method for defining an electronic circuit from an electronic device array comprising a substrate and a plurality of transistors located on the substrate, each transistor having at least one interconnection electrode for allowing interconnection of the transistors; the method comprising defining a pattern of interconnection between at least two of the transistors by ink-jet printing conductive material on the electronic device array so as to provide a conductive interconnect line between two of the interconnection electrodes.

15. A method as claimed in claim 14, wherein one of the said two transistors is part of a pre-connected functional block of transistors on the substrate.

16. A method as claimed in claim 14, wherein each of the transistors is formed from polymer material.

17. A method as claimed in claim 15, wherein the polymer material comprises a conductive or semiconductive polymer.

18. A method as claimed in claim 14, wherein the electronic device array includes one or more passive circuit elements and the method includes the step of ink-jet printing conductive material on the electronic device array so as to provide a conductive path between an interconnection electrode of one of the transistors and one of the passive circuit elements.

19. A method as claimed in claim 14, wherein the electronic device array includes one or more further active circuit elements.

20. A method as claimed in claim 19, comprising the step of forming a display element over at least one of the transistors with an electrode of the display element in electrical connection with an electrode of one of the transistors.

21. A method as claimed in claim 14, wherein the step of ink-jet printing is performed by means of an ink-jet printer having at least on printing head operable under computer control to deposit material in a selected location on the electronic device array.

22. A method as claim in claim 14, wherein the step of ink-jet printing includes the steps of detecting optical contrast one the electronic device array, and performing processing on the basis of the contrast in order to direct the printing head under computer control to achieve good registration accuracy with respect to a previously deposited pattern.

23. A method as claimed in claim 14, wherein the ink-jet printer is operable for depositing conductive and/or insulating material in order in order to define a user-selected circuit on the electronic device array by means of ink-jet printing.

24. A method as claimed in claim 14, wherein the substrate include a structure between electrodes of the transistors for confining liquid deposited on the electronic device array in a pre-defined path between the electrodes by means of relative attraction and/or repellence for the liquid.

25. The method according to claim 14 further comprising:
placing the electronic device array in an ink-jet printer having a printing head for a suitable material for forming conductive interconnect lines, and
using the ink-jet printer to define said pattern of interconnection in order to configure a circuit for performing a desired electronic or logic function.

26. The method according to claim 14, wherein the electronic device array is a gate array.

* * * * *